(12) United States Patent
Makowski et al.

(10) Patent No.: US 8,136,088 B2
(45) Date of Patent: Mar. 13, 2012

(54) TASK BASED POLYMORPHIC GRAPHICAL PROGRAM FUNCTION NODES

(75) Inventors: Thomas A. Makowski, Austin, TX (US); Rajesh Vaidya, Austin, TX (US); Deborah E. Bryant, Austin, TX (US); Brian M. Johnson, Austin, TX (US)

(73) Assignee: National Instruments Corporation, Austin, TX (US)

( * ) Notice: Subject to any disclaimer, the term of this patent is extended or adjusted under 35 U.S.C. 154(b) by 2261 days.

(21) Appl. No.: 10/602,551

(22) Filed: Jun. 24, 2003

(65) Prior Publication Data

US 2004/0046806 A1 Mar. 11, 2004

Related U.S. Application Data

(63) Continuation-in-part of application No. 10/179,149, filed on Jun. 24, 2002, now Pat. No. 6,880,130.

(60) Provisional application No. 60/471,058, filed on May 16, 2003.

(51) Int. Cl.
*G06F 9/44* (2006.01)
*G06F 3/00* (2006.01)
*G06F 3/048* (2006.01)

(52) U.S. Cl. ........ 717/109; 717/105; 717/113; 715/700; 715/763

(58) Field of Classification Search .................. 717/105, 717/109

See application file for complete search history.

(56) References Cited

U.S. PATENT DOCUMENTS

| | | | |
|---|---|---|---|
| 5,301,301 A | 4/1994 | Kodosky et al. | |
| 5,485,600 A | 1/1996 | Joseph et al. | |
| 5,821,934 A | 10/1998 | Kodosky et al. | |
| 5,850,548 A | 12/1998 | Williams | |
| 5,995,916 A | 11/1999 | Nixon et al. | |
| 6,064,409 A * | 5/2000 | Thomsen et al. | 715/700 |
| 6,064,812 A * | 5/2000 | Parthasarathy et al. | 717/105 |
| 6,102,965 A * | 8/2000 | Dye et al. | 717/109 |
| 6,216,138 B1 | 4/2001 | Wells et al. | |
| 6,282,699 B1 * | 8/2001 | Zhang et al. | 717/109 |

(Continued)

OTHER PUBLICATIONS

Resendez et al., Labview programming for internet-based measurements, Apr. 2003, pp. 79-85, <http://delivery.acm.org/10.1145/770000/767613/p79-resendez.pdf>.*

(Continued)

*Primary Examiner* — Thuy Dao
(74) *Attorney, Agent, or Firm* — Meyertons Hood Kivlin Kowet & Goetzel, P.C.; Jeffrey C. Hood; Mark S. Williams

(57) ABSTRACT

A task based polymorphic graphical program node system and method. A node is displayed in a graphical program. First user input is received invoking display of a plurality of function type options for the node, and the function type options for the node displayed. Second user input is received specifying a function type from the function type options. Based on the second user input, program instructions executable to provide functionality in accordance with the specified function type are determined and associated with the node, after which the node is executable in the graphical program to provide the functionality in accordance with the specified function type. Associating the program instructions with the node may include configuring the (possibly generic) node with the program instructions, replacing default program instructions of the node implementing default node functionality with the program instructions, and/or replacing the node with another node that includes the program instructions.

24 Claims, 14 Drawing Sheets

U.S. PATENT DOCUMENTS

| | | | |
|---|---|---|---|
| 6,292,810 B1 | 9/2001 | Richards | |
| 6,366,300 B1 | 4/2002 | Ohara et al. | |
| 6,437,805 B1 | 8/2002 | Sojoodi et al. | |
| 6,763,515 B1* | 7/2004 | Vazquez et al. | 717/109 |
| 7,216,334 B2* | 5/2007 | Kodosky et al. | 717/109 |
| 7,631,295 B2* | 12/2009 | Makowski et al. | 717/113 |
| 7,761,846 B2* | 7/2010 | Hayles | 717/109 |
| 7,937,665 B1* | 5/2011 | Vazquez et al. | 715/763 |
| 7,975,233 B2* | 7/2011 | Macklem et al. | 715/763 |
| 2001/0024211 A1* | 9/2001 | Kudukoli et al. | 345/763 |
| 2002/0196285 A1 | 12/2002 | Sojoodi et al. | |
| 2003/0172369 A1 | 9/2003 | Kodosky et al. | |
| 2003/0234802 A1 | 12/2003 | Makowski et al. | |
| 2005/0155014 A1* | 7/2005 | Andrade et al. | 717/105 |
| 2008/0022259 A1* | 1/2008 | MacKlem et al. | 717/113 |

OTHER PUBLICATIONS

National Instruments Inc., Polymorphic Units in LabVIEW, Jul. 2000, 8 pages, <http://mp.ustu.ru/Users/Kalinin/Files/LabView/National%20Instruments6.0/polyunit.pdf>.*

Bitter et al., Object-Oriented Programming in LabVIEW, 2001, 45 pages, <http://www.physics.utah.edu/~jui/3620-6620/supp/LV_Adv_Prog/2049ch10.pdf>.*

International Search Report, Application No. PCT/US03/19865, Mailed Sep. 12, 2003.

Hudson, Duncan and Erica Rokicki Bono, "System and Method for Enabling Graphical Program Polymorphism," U.S. Appl. No. 09/569,863, filed May 12, 2000.

"DSP Blockset Users Guide—For Use with SIMULINK"; Nov. 2000; pp. 5-13-5-16; Version 4; The MathWorks Inc.; Natick, MA.

* cited by examiner

TASK BASED POLYMORPHIC GRAPHICAL PROGRAM FUNCTION NODES

PRIORITY DATA

This application claims benefit to U.S. provisional application Ser. No. 60/471,058 titled "Task Based Polymorphic Graphical Program Function Nodes, Function Specific Graphical Program Property Nodes, and Palette Of Graphical Program Nodes," filed May 16, 2003, whose inventors were Thomas A. Makowski, Rajesh Vaidya, Deborah E. Bryant, Brian M. Johnson and Stephen C. Thorne.

This application is a continuation-in-part of U.S. patent application Ser. No. 10/179,149 titled "Specifying Timing and Triggering Functionality in a Graphical Program Using Graphical Programming Nodes" filed on Jun. 24, 2002 now U.S. Pat. No. 6,880,130, whose inventors were Thomas A. Makowski, Rajesh Vaidya and Brian M. Johnson.

FIELD OF THE INVENTION

The present invention relates to the field of graphical programming, and more particularly to polymorphic graphical program nodes in a graphical programming language. A palette for displaying these nodes is also described.

DESCRIPTION OF THE RELATED ART

Traditionally, high level text-based programming languages have been used by programmers in writing application programs. Many different high level text-based programming languages exist, including BASIC, C, C++, JAVA, FORTRAN, PASCAL, COBOL, ADA, APL, etc. Programs written in these high level text-based languages are translated to the machine language level by translators known as compilers or interpreters. The high level text-based programming languages in this level, as well as the assembly language level, are referred to herein as text-based programming environments.

Increasingly, computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. The task of programming a computer system to model or implement a process often is further complicated by the fact that a sequence of mathematical formulas, steps or other procedures customarily used to conceptually model a process often does not closely correspond to the traditional text-based programming techniques used to program a computer system to model such a process. In other words, the requirement that a user program in a text-based programming environment places a level of abstraction between the user's conceptualization of the solution and the implementation of a method that accomplishes this solution in a computer program. Thus, a user often must substantially master different skills in order to both conceptualize a problem or process and then to program a computer to implement a solution to the problem or process. Since a user often is not fully proficient in techniques for programming a computer system in a text-based environment to implement his solution, the efficiency with which the computer system can be utilized often is reduced.

To overcome the above shortcomings, various graphical programming environments now exist which allow a user to construct a graphical program or graphical diagram, also referred to as a block diagram. U.S. Pat. Nos. 4,901,221; 4,914,568; 5,291,587; 5,301,301; and 5,301,336; among others, to Kodosky et al disclose a graphical programming environment which enables a user to easily and intuitively create a graphical program. Graphical programming environments such as that disclosed in Kodosky et al can be considered a higher and more intuitive way in which to interact with a computer. A graphically based programming environment can be represented at a level above text-based high level programming languages such as C, BASIC, JAVA, etc.

A user may assemble a graphical program by selecting various nodes, e.g., icons such as function nodes, terminals nodes, structure nodes, etc., which represent desired functionality, and then connecting the nodes together to create the program. The nodes may be connected by lines representing data flow between the nodes, control flow, or execution flow. Thus the block diagram may include a plurality of interconnected icons such that the diagram created graphically displays a procedure or method for accomplishing a certain result, such as manipulating one or more input variables and/or producing one or more output variables. In response to the user constructing a diagram or graphical program using the block diagram editor, data structures and/or program instructions may be automatically constructed which characterize an execution procedure that corresponds to the displayed procedure. The graphical program may be compiled or interpreted by a computer.

A graphical program may have a graphical user interface. For example, in creating a graphical program, a user may create a front panel or user interface panel. The front panel may include various graphical user interface elements or front panel objects, such as user interface controls and/or indicators, that represent or display the respective input and output that will be used by the graphical program, and may include other icons which represent devices being controlled.

Thus, graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, modeling, simulation, image processing/machine vision applications, and motion control, among others.

SUMMARY OF THE INVENTION

Various embodiments of task based polymorphic graphical program function nodes and methods of use are presented. In one embodiment, a polymorphic graphical program node may be selected and configured during development and/or configuration of a graphical program, where the graphical program implements a task. The polymorphic graphical program function node, referred to herein as the function node or "first node", is preferably executable in the graphical program to perform a specified function in accordance with a selectable or switchable function node type, as will be explained in more detail below.

In one embodiment, one or more polymorphic function nodes may be used to configure a computer system, an instrument, or other device to perform a function, e.g., a measurement function, although various embodiments of the present invention are also applicable to any other type of task, as well. For example, in an application where the instrument is an image acquisition device (e.g., smart camera), the graphical program may implement an image processing function.

First, the graphical program may optionally be created on a computer system (or on a different computer system and transmitted to the computer system). The graphical program may be created or assembled by the user arranging on a display a plurality of nodes or icons and then interconnecting the nodes to create the graphical program that visually indicates the functionality of the program. The graphical program may comprise a block diagram and may also include a user interface portion or front panel portion. Where the graphical program includes a user interface portion, the user may assemble the user interface on the display. As one example, the user may use the LabVIEW graphical programming development environment to create the graphical program. In an alternate embodiment, the graphical program may be created by the user creating or specifying a prototype, followed by automatic or programmatic creation of the graphical program from the prototype or in other manners, either by the user or programmatically, as desired. The graphical program may implement any of a variety of functions, e.g., a measurement function, which the user desires to be performed by the instrument.

A first function node may be displayed in the graphical program, e.g., on a display of the computer, e.g., in response to user input specifying the first function node. For example, the user input specifying the first function node may include the user dragging and dropping the first function node from a palette to the graphical program. In a preferred embodiment, the first function node may be polymorphic. Said another way, the first node is preferably function type-switchable. As used herein, the term "polymorphic" refers to nodes which may share a name and/or an icon, but which may have different functionality. Thus, the first polymorphic node may share a name and/or an icon with one or more other nodes, or node functionalities, where, depending upon the selected function type, the underlying functionality of the node may be changed or exchanged in accordance with a selected function type, as described below. Stated another way, a polymorphic node may have a single name and/or icon, but may be configured, e.g., by a user, to have different functionality. Thus the polymorphic node may be considered as either a single "node" having a single name and/or an icon, but configurable with different functionality, or may be considered as a plurality of "nodes" which share a single name and/or an icon, with each of these nodes having different functionality.

The polymorphic node may be configured to have different functionality in a particular "function class". Examples of function classes include read, write, timing, and triggering, among others. Thus, a polymorphic read node may be configured to have different read functionality, e.g., the polymorphic read node may be configured for analog or digital reads, single or multi channel, un-scaled data, number of samples, data types (e.g., a 1D waveform array or a 2D array of doubles), etc. In a similar manner, a polymorphic write node may have configurable write parameters for configuring the functionality of the write node, e.g., the polymorphic write node may be configured for analog or digital writes, single or multi channel, un-scaled data, number of samples, data types (e.g., a 1D waveform array or a 2D array of doubles), etc. A polymorphic timing node may be configured to have different timing functionality, e.g., a "Handshaking (Digital)" function type, an "Implicit (Counter)" function type, a "Sample Clock (Analog/Counter)" and a "Use Waveform (Analog Output)" function type, among others. A polymorphic triggering node may be configured to have different triggering functionality, e.g., the polymorphic trigger node may be configured for digital or analog edge for start or reference, analog window for start or reference, etc. A polymorphic channel creation node may be configured to have different channel creation functionality, e.g., the polymorphic channel creation node may be configured for analog or digital input or output, with various phenomena types such as voltage, temperature, current, resistance, strain, frequency, etc., as well as counter input, such as frequency, period, count edges, pulse width, semi period, etc., and output types, such as pulse generation based on frequency, time, or ticks, etc.

In an alternate embodiment, a polymorphic node may be configured to have different functionality selected from two or more particular "function classes", e.g., a single "access node" that is polymorphic as to both a read function class and write function class.

First user input may be received invoking display of a plurality of function type options for the first node. In a preferred embodiment, the first user input may be received by the first node. For example, the user may "left-click" on the node, thereby invoking the display, although any other means of invocation may also be used to invoke the display. The plurality of function type options for the first node may be displayed in response to the first user input. Each function type option displayed may correspond to a respective functionality of the first node. For example, for a timing function node or VI with polymorphic functionality, a display of function type options (e.g., timing type options) may be displayed. For example, the user may left-click on the function node, and a graphical user interface, e.g., a menu, may be presented showing the available timing function type options. In another embodiment, the timing type options may be presented automatically when the node is deployed to the graphical program, e.g., when the user "drags and drops" the node onto the block diagram of the graphical program.

Using the timing node example above, in one embodiment, the plurality of function type options for the timing node may include a "Handshaking (Digital)" function type, an "Implicit (Counter)" function type, a "Sample Clock (Analog/Counter)" and a "Use Waveform (Analog Output)" function type, where each function type option corresponds to a specific functional version of the timing node functionality. The polymorphic node may be originally set with a default function type. For example, the timing polymorphic node may be originally set with the "Sample Clock (Analog/Counter)" function type. Thus, in one embodiment, when the function node is placed on a block diagram, the node may be in a default configured state. In one embodiment, the node or VI may initially appear with a Selector (e.g., labeled "Sample Clock"), referred to as a PolyVI Selector, indicating that it is configured for Sample Clock timing. The user may select (e.g., "click on") this PolyVI Selector to set the node to other functional types of timing. In another embodiment, the polymorphic node may not have a default function type.

Then, second user input may be received specifying a function type from the plurality of function type options. For example, in the timing function node example from above, any of the options may be selected by the user, e.g., by clicking on the option, navigating through the options via arrow keys, double-clicking on a menu item, etc. In another embodiment, the function type for a polymorphic function node may be determined programmatically, e.g., based on inputs provided to the node, a current configuration of the system where the node is being used, or other information.

In a preferred embodiment, the second user input may be received by the node. User input received by the node may comprise a user graphically selecting the node, e.g., by clicking on the node. Thus receiving the first user input preferably includes receiving the first user input to the first node. Similarly, receiving the second user input preferably includes receiving the second user input to the first node, although it should be noted that in other embodiments, the user input may be received by other elements, e.g., by menus or dialogs presented in the development environment, by speech recognition, etc.

Then, program instructions based on the second user input may be determined, where the determined program instructions are executable to provide functionality in accordance with the specified function type. In other words, once the function type for the node has been selected, the program instructions implementing the selected functionality may be determined. Note that the term "program instructions" may refer to one or more of: machine executable code, text-based program source code, graphical program code, data structures, hardware configuration data, e.g., for a programmable hardware element, and/or any other type of software instructions or data useable in providing functionality for the graphical program.

In one embodiment, each polymorphic function node includes a plurality of different sets of program instructions that correspond to the different function types of the node. When the user selects a particular function type, the sets of program instructions that correspond to that selected function type are associated with the node icon. In another embodiment, the program instructions that correspond to a selected function type are dynamically programmatically created after the user selects the function type. This may allow the programmatically created program instructions to be based on a current configuration of the system or other nodes present in the graphical program.

The determined program instructions may then be associated with the first node. In other words, the node may be configured to include the determined program instructions implementing the desired functionality, where, when the first node executes in the graphical program, the determined program instructions are operable to execute to provide the functionality in accordance with the specified function type.

Although in a preferred embodiment, the first node initially has a default configuration, as noted above, in other embodiments, prior to associating the determined program instructions with the first node, the first node may not have any associated program instructions implementing a specific functionality. In other words, the node may initially be generic, e.g., a substantially "blank slate" which must be configured to perform a desired functionality.

For example, in one embodiment, prior to said associating, the first node may be a generic function node for a broad functionality, e.g., a generic read node, a generic write node, or a generic channel creation node. After the associating, the first node may be a specific function node of that functionality, e.g., a specific read node in accordance with the specified function type, a specific write node in accordance with the specified function type, or a specific channel creation node in accordance with the specified function type. As other examples, prior to associating, the first node may be a generic timing node or a generic triggering node, and after associating, the first node may be a specific timing node in accordance with the specified function type, or a specific triggering node in accordance with the specified function type.

In one embodiment, where the first node has a first node icon having a first appearance which is displayed in the graphical program, the first node icon may be changed to a second appearance based on the second user input. In other words, the node's visual appearance may be changed to reflect the specified function type of the node. For example, the node icon's color, shape, label, and/or design may be modified to reflect the function type or functionality of the node. In one embodiment, the terminals of the node (icon) may be modified in accordance with the specified function type. In another embodiment, changing the first node icon to a second appearance may include replacing the first node icon with a second node icon.

There are various ways that the node may be configured with the determined program instructions. For example, in an embodiment where, prior to said associating the determined program instructions with the first node, the first node is of a default function type of the plurality of function type options, where the first node has associated default program instructions in accordance with the default function type, and the where the default program instructions implement a first functionality, associating the determined program instructions with the first node may include replacing the default program instructions with the determined program instructions. In other words, the first node's original functionality may be "swapped" with a second functionality (implemented by the determined program instructions).

In another embodiment, the first node may be replaced (programmatically) with a second node, where the second node includes the determined program instructions implementing the desired functionality. In this case, associating the determined program instructions with the first node may include replacing the first node in the graphical program with the second node, where the second node is operable to provide functionality for the graphical program in accordance with the specified function type. The first node may include a first node icon, and displaying the first node may include displaying the first node icon. In one embodiment, the second node may include the first node icon, and the determined program instructions. In other words, the first node may be replaced by the second node, but the node icon may not be replaced. In another embodiment, the second node may include a second node icon, and the determined program instructions, i.e., the first node's icon may be replaced by the second node's icon, which is used to display the second node in the graphical program (or in a palette of nodes).

Thus, in the timing node example, the second node may include program instructions and/or data structures for implementing timing configuration in accordance with the specified timing type. For example, the second node may include program instructions (and/or data structures) in a text-based programming language such as C or C++ (or any other programming language) which is compilable, interpretable, and/or executable to provide the determined functionality for the graphical program, e.g., upon or during execution of the graphical program.

In one embodiment, the second node may itself be polymorphic, as defined above. In other words, in one embodiment, the second node may be function type-switchable, such that the user may subsequently select a different function type for the second node, thereby invoking replacement of the second node with a third node of the selected function type.

Thus, in various embodiments, the implementation of the polymorphic nature of the function node may be considered as a node replacement, where the first node is replaced by the second node comprising appropriate program instructions, and/or as a node configuration, where the first node is configured with a different functionality, i.e., by associating the appropriate program instructions with the first node. Note that in the context of the present invention, these two approaches are considered not so much as distinct and mutually exclusive, but rather as defining a continuum, in that in various embodiments or implementations, various aspects of the node and its functionality may be configured and/or replaced to various degrees as desired, resulting in substantially the same effective conversion of the node functionality.

It should be noted that the conversion of the node functionality (e.g., via configuration, replacement, or a combination of both) may change not only the functionality of the node, i.e., the functions used, but may also change its parameters. For example, in the timing node example from above, the "Sample Clock" variation may include input parameters that are only relevant for the "Sample Clock" timing functionality. Similarly, the "Handshaking" variation may include parameters relevant to that type of timing functionality. For example, "rate", "source", and "active edge" parameters may appear in the Sample Clock variation, but not in the Handshaking variation, because these parameters are not appropriate for the Handshaking variation.

A more complex example of a polymorphic, i.e., function type-switchable, function node, more specifically, a polymorphic DAQ (Data Acquisition) read node, is now described. In this example, the read node initially has a default function type, e.g., when first placed on a block diagram, specifically, by default the read node is configured for a single channel, single sample analog acquisition, returning its data in a scalar double-precision number. It should be noted that this embodiment of a polymorphic read node is presented as an exemplary function node and is not intended to limit the function node to any particular class, i.e., any particular set of specific functions. As mentioned above, other classes of polymorphic function nodes contemplated include a write node, a timing node, a triggering node, a channel creation node, a task creation node, a virtual channel creation node, a "wait until done" node (related to task/device status in a signal generation operation), a start node, a stop node, and a clear node, among others.

In this example, the invocation of the available function types for the read node may result in display of a partial list of function type options, where subsequent function type options are presented in a hierarchy of "pull-right" menus. In this example, the PolyVI selector may indicate that this node or VI may be configured for other types of acquisition (e.g., digital or counter), for one or many channels, for un-scaled data, for one or many samples, and for other data types (e.g., a 1D waveform array or a 2D array of doubles). It should be noted that the selectable function type options described are exemplary only, and are not intended to limit the function type options to any particular set.

It is noted that in prior art function nodes, only the data type of the nodes were selectable. In contrast, according to various embodiments of the present invention, the polymorphism relates to or includes the attributes of the task, e.g., the I/O subsystem (analog vs. digital vs. counter), the number of channels, and the timing (one vs. many samples). Thus, in the prior art approaches, in developing graphical programs, users were required to select from among a collection of many different nodes. In contrast, embodiments of the present invention provide single nodes that may be configured for any of various functionalities, e.g., a single read node and a single write node that can each be configured for many kinds of I/O.

Thus, the function node polymorphism described herein removes the necessity to include many different types of function nodes of the same broad class in a palette, thereby substantially simplifying and easing programming for the user.

BRIEF DESCRIPTION OF THE DRAWINGS

A better understanding of the present invention can be obtained when the following detailed description of the preferred embodiment is considered in conjunction with the following drawings, in which.

Figure 1A:
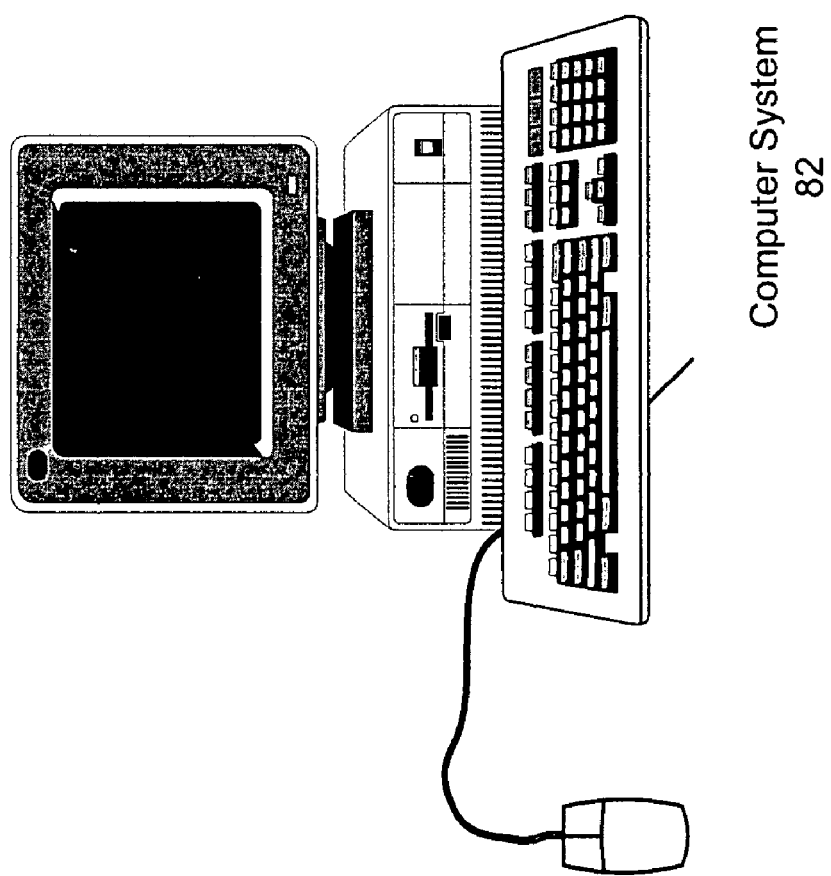
FIG. 1A illustrates a computer system operable to execute a graphical program according to an embodiment of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Patent Application Publication No. 20010020291 (Ser. No. 09/745,023) titled "System and Method for Programmatically Generating a Graphical Program in Response to Program Information," filed Dec. 20, 2000.

U.S. patent application Ser. No. 09/886,455 titled "System and Method for Programmatically Generating a Graphical Program in Response to User Input," filed Jun. 20, 2001.

U.S. patent application Ser. No. 10/008,792 titled "Measurement System Software Architecture for Easily Creating High-Performance Measurement Applications," filed Nov. 13, 2001.

U.S. patent application Ser. No. 10/008,792 titled "Measurement System Graphical User Interface for Easily Configuring Measurement Applications," filed Apr. 24, 2002.

U.S. patent application Ser. No. 10/179,149 titled "Specifying Timing and Triggering Functionality in a Graphical Program Using Graphical Programming Nodes" filed on Jun. 24, 2002, whose inventors were Thomas A. Makowski, Rajesh Vaidya and Brian M. Johnson.

U.S. Provisional Application Ser. No. 60/471,058 titled "Task Based Polymorphic Graphical Program Function Nodes, Function Specific Graphical Program Property Nodes, and Palette Of Graphical Program Nodes," filed May 16, 2003.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a nonvolatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW, DasyLab, DiaDem and Matrixx/SystemBuild from National Instruments, Simulink from the MathWorks, VEE from Agilent, WiT from Coreco, Vision Program Manager from PPT Vision, SoftWIRE from Measurement Computing, Sanscript from Northwoods Software, Khoros from Khoral Research, SnapMaster from HEM Data, VisSim from Visual Solutions, ObjectBench by SES (Scientific and Engineering Software), and VisiDAQ from Advantech, among others.

The term "graphical program" includes models or block diagrams created in graphical modeling environments, wherein the model or block diagram comprises interconnected nodes or icons that visually indicate operation of the model or block diagram; exemplary graphical modeling environments include Simulink, SystemBuild, VisSim, Hypersignal Block Diagram, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected nodes are often referred to as the block diagram portion of the graphical program.

Node—In the context of a graphical program, an element that may be included in a graphical program. A node may have an associated icon that represents the node in the graphical program, as well as underlying code or data that implements functionality of the node. Exemplary nodes include function nodes, terminal nodes, structure nodes, etc. Nodes may be connected together in a graphical program by connection icons or wires.

Data Flow Graphical Program (or Data Flow Diagram)—A graphical program or diagram comprising a plurality of interconnected nodes, wherein the connections between the nodes indicate that data produced by one node is used by another node.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more data acquisition (DAQ) or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

FIG. 1A—Computer System

FIG. 1A illustrates a computer system 82 operable to store and execute program instructions for invoking functionality of a configuration tool from a graphical programming language. One embodiment of a method for invoking functionality of a configuration tool from a graphical programming language is described below.

As shown in FIG. 1A, the computer system 82 may include a display device operable to display the graphical program as the graphical program is created and/or executed. The display device may also be operable to display a graphical user interface or front panel of the graphical program during execution of the graphical program. The graphical user interface may comprise any type of graphical user interface, e.g., depending on the computing platform.

The computer system 82 may include a memory medium(s) on which one or more computer programs or software components according to one embodiment of the present invention may be stored. For example, the memory medium may store one or more programs, e.g., text based or graphical programs, which are executable to perform the methods described herein. Also, the memory medium may store a graphical programming development environment application used to create and/or execute graphical programs according to various embodiments of the present invention. The memory medium may also store operating system software, as well as other software for operation of the computer system. Various embodiments further include receiving or storing instructions and/or data implemented in accordance with the foregoing description upon a carrier medium.

Figure 1B:
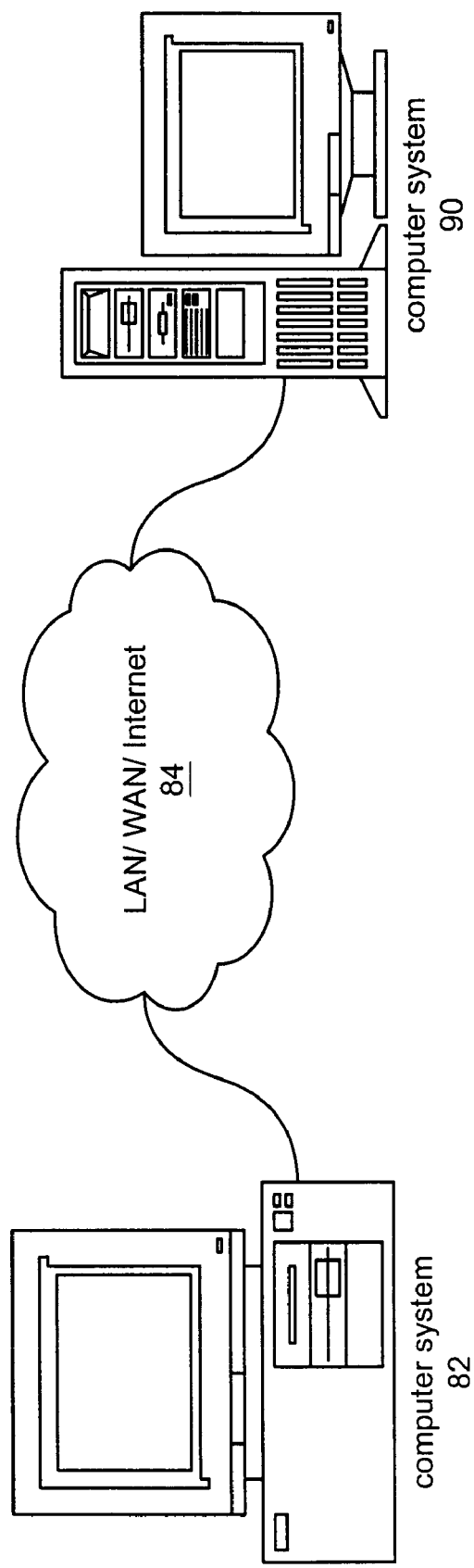
FIG. 1B illustrates a network system comprising two or more computer systems that may implement an embodiment of the present invention.

FIG. 1B—Computer Network

FIG. 1B illustrates a system including a first computer system 82 that is coupled to a second computer system 90. The computer system 82 may be connected through a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a graphical program in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In one embodiment, the graphical user interface of the graphical program may be displayed on a display device of the computer system 82, and the block diagram may execute on a device 190 connected to the computer system 82. The device 190 may include a programmable hardware element and/or may include a processor and memory medium which may execute a real time operating system. In one embodiment, the graphical program may be downloaded and executed on the device 190. For example, an application development environment with which the graphical program is associated may provide support for downloading a graphical program for execution on the device in a real time system.

Exemplary Systems

Embodiments of the present invention may be involved with performing test and/or measurement functions, e.g., data acquisition and/or signal generation; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
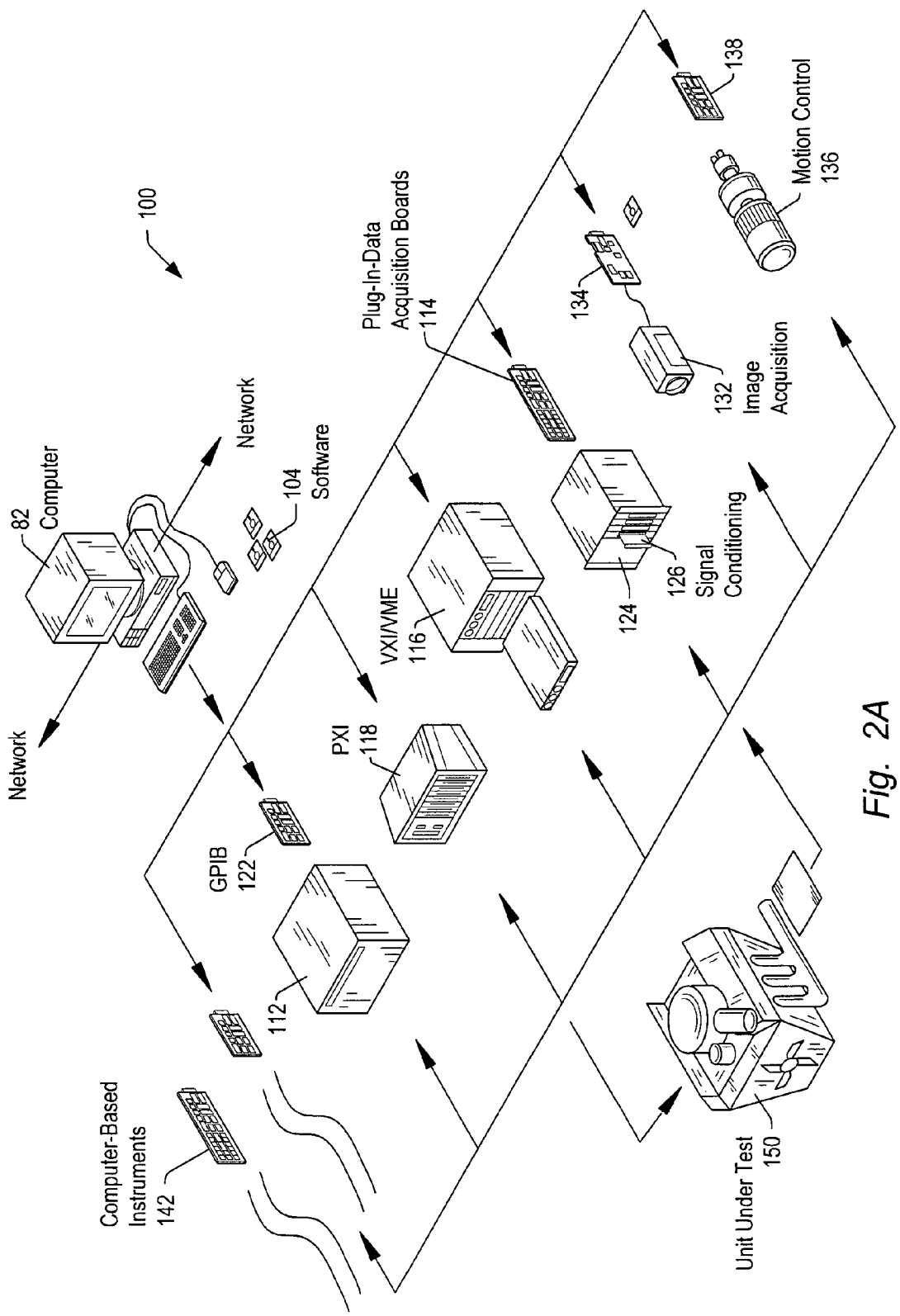
FIG. 2A illustrates an instrumentation control system according to one embodiment of the invention.

FIG. 2A illustrates an exemplary instrumentation control system 100 which may implement embodiments of the invention. The system 100 comprises a host computer 82 which connects to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application.

Figure 2B:
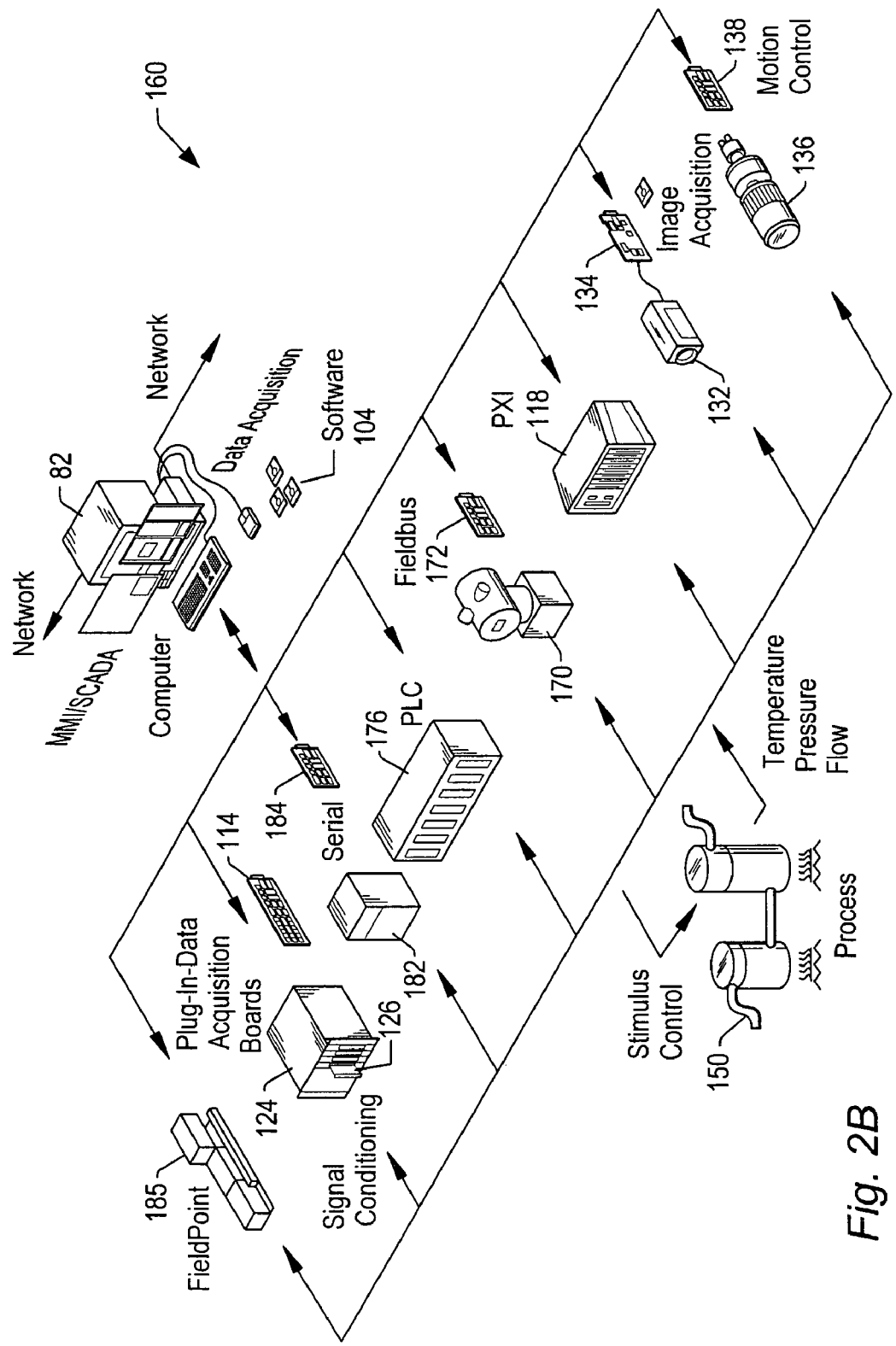
FIG. 2B illustrates an industrial automation system according to one embodiment of the invention.

FIG. 2B illustrates an exemplary industrial automation system 160 which may implement embodiments of the invention. The industrial automation system 160 is similar to the instrumentation or test and measurement system 100 shown in FIG. 2A. Elements which are similar or identical to elements in FIG. 2A have the same reference numerals for convenience. The system 160 may comprise a computer 82 which connects to one or more devices or instruments. The computer 82 may comprise a CPU, a display screen, memory, and one or more input devices such as a mouse or keyboard as shown. The computer 82 may operate with the one or more devices to a process or device 150 to perform an automation function, such as MMI (Man Machine Interface), SCADA (Supervisory Control and Data Acquisition), portable or distributed data acquisition, process control, advanced analysis, or other control.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

Figure 3A:
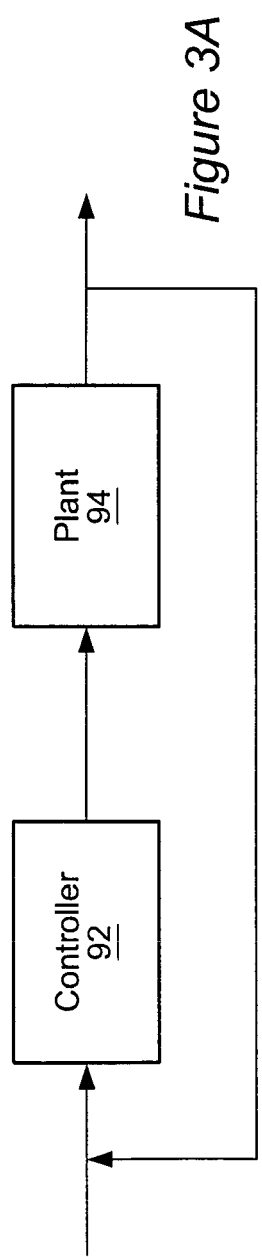
FIG. 3A is a high level block diagram of an exemplary system which may execute or utilize graphical programs.

FIG. 3A is a high level block diagram of an exemplary system which may execute or utilize graphical programs. FIG. 3A illustrates a general high-level block diagram of a generic control and/or simulation system which comprises a controller 92 and a plant 94. The controller 92 represents a control system/algorithm the user may be trying to develop. The plant 94 represents the system the user may be trying to control. For example, if the user is designing an engine control unit (ECU) for a car, the controller 92 is the ECU and the plant 94 is the car's engine (and possibly other components such as transmission, brakes, and so on.) As shown, a user may create a graphical program that specifies or implements the functionality of one or both of the controller 92 and the plant 94. For example, a control engineer may use a modeling and simulation tool to create a model (graphical program) of the plant 94 and/or to create the algorithm (graphical program) for the controller 92.

Figure 3B:
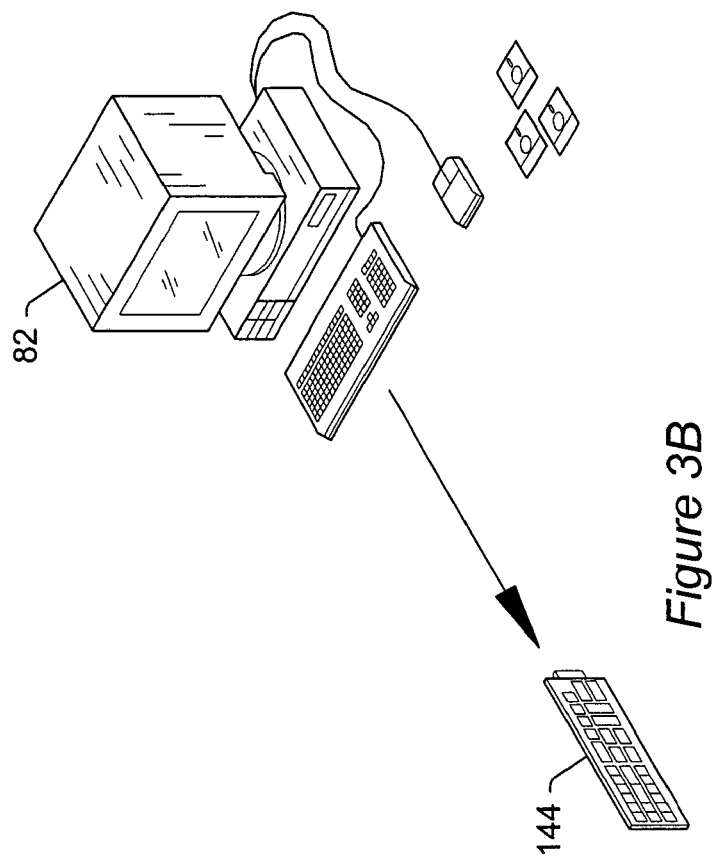
FIG. 3B illustrates an exemplary system suitable for performing control and/or simulation functions utilizing graphical programs.

FIG. 3B illustrates an exemplary system which may perform control and/or simulation functions. As shown, the controller 92 may be implemented by a computer system 82 or other device (e.g., including a processor and memory medium and/or including a programmable hardware element) that executes or implements a graphical program. In a similar manner, the plant 94 may be implemented by a computer system or other device 144 (e.g., including a processor and memory medium and/or including a programmable hardware element) that executes or implements a graphical program, or may be implemented a real physical system, e.g., a car engine.

In one embodiment of the invention, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical program, and the graphical program may execute on the controller 92, e.g., on a computer system or other device. The computer system 82 may be a platform that supports real time execution, e.g., a device including a processor that executes a real time operating system (RTOS), or a device including a programmable hardware element.

In one embodiment of the invention, one or more graphical programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 2A, 2B, and 3B above, one or more of the various devices may couple to each other over a network, such as the Internet. In one embodiment, the user operates to select a target device from a plurality of possible target devices for programming or configuration using a graphical program. Thus the user may create a graphical program on a computer and use (execute) the graphical program on that computer or deploy the graphical program to a target device (for remote execution on the target device) that is remotely located from the computer and coupled to the computer through a network.

Graphical software programs which perform data acquisition, analysis and/or presentation, e.g., for measurement, instrumentation control, industrial automation, modeling, or simulation, such as in the applications shown in FIGS. 2A and 2B, may be referred to as virtual instruments (VIs).

Figure 4:
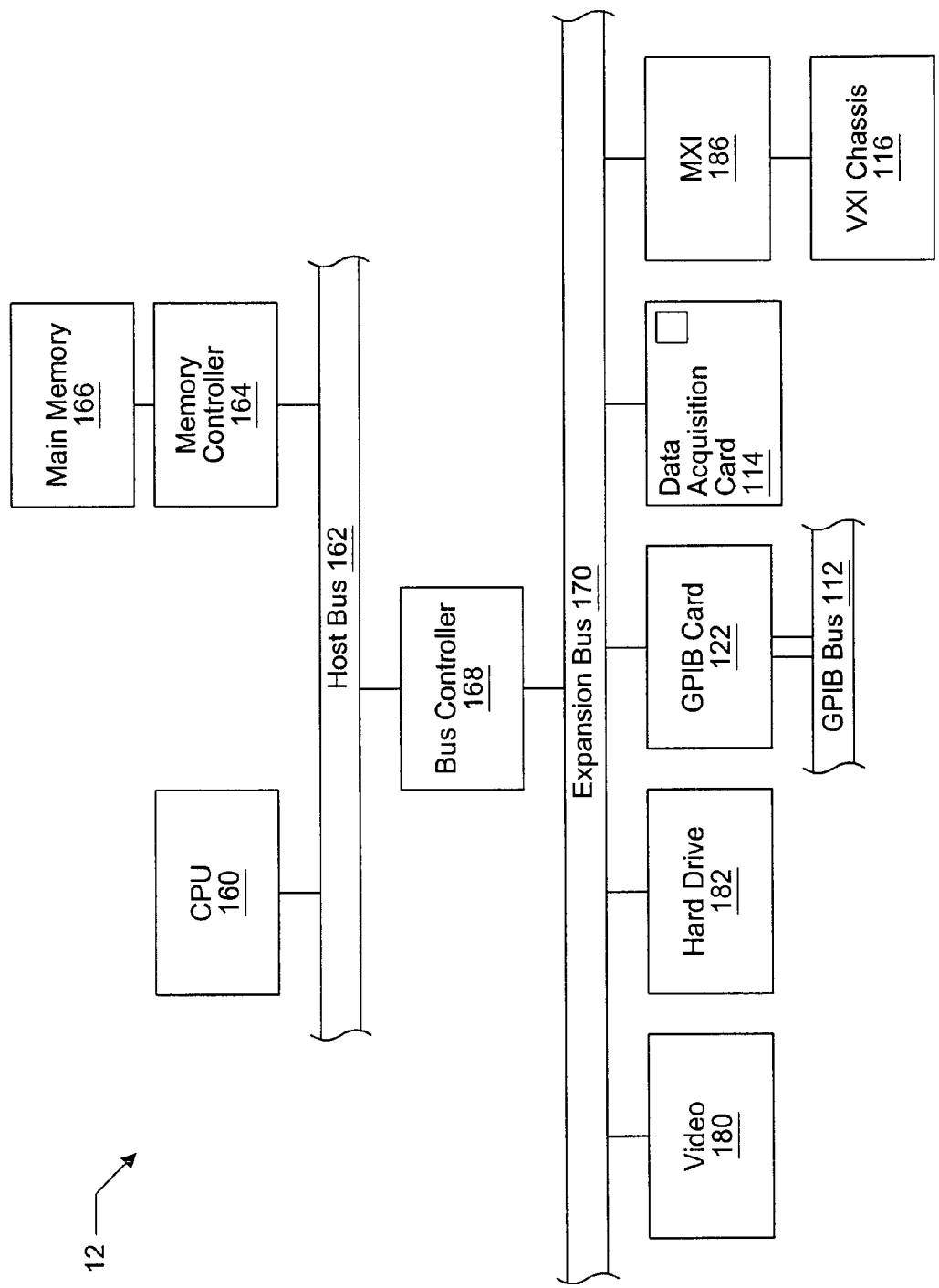
FIG. 4 is an exemplary block diagram of the computer systems of FIGS. 1A, 1B, 2A, 2B, and 3A.

FIG. 4—Computer System Block Diagram

FIG. 4 is a block diagram representing one embodiment of the computer system 82 and/or 90 illustrated in FIGS. 1A and 1B, or computer system 82 shown in FIG. 2A or 2B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store program instructions for invocation and use of a configuration tool or functionality thereof from a graphical programming language, as well as one or more graphical programs according to various embodiments of the present invention. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170.

As shown, various devices may also be connected to the computer. For example, as FIG. 4 shows, exemplary devices may include one or more of a video adaptor 180, a hard drive 182, a bus card, such as a GPIB card 122 and GPIB bus 112, a DAQ card 114, and an MXI card 186 coupled to a VXI chassis 116, among others. In one embodiment, a device coupled to the computer may include a processor and memory which may execute a real time operating system. The device may also or instead comprise a programmable hardware element. The computer system may be operable to deploy a graphical program to the device for execution of the graphical program on the device. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program.

Figure 5:
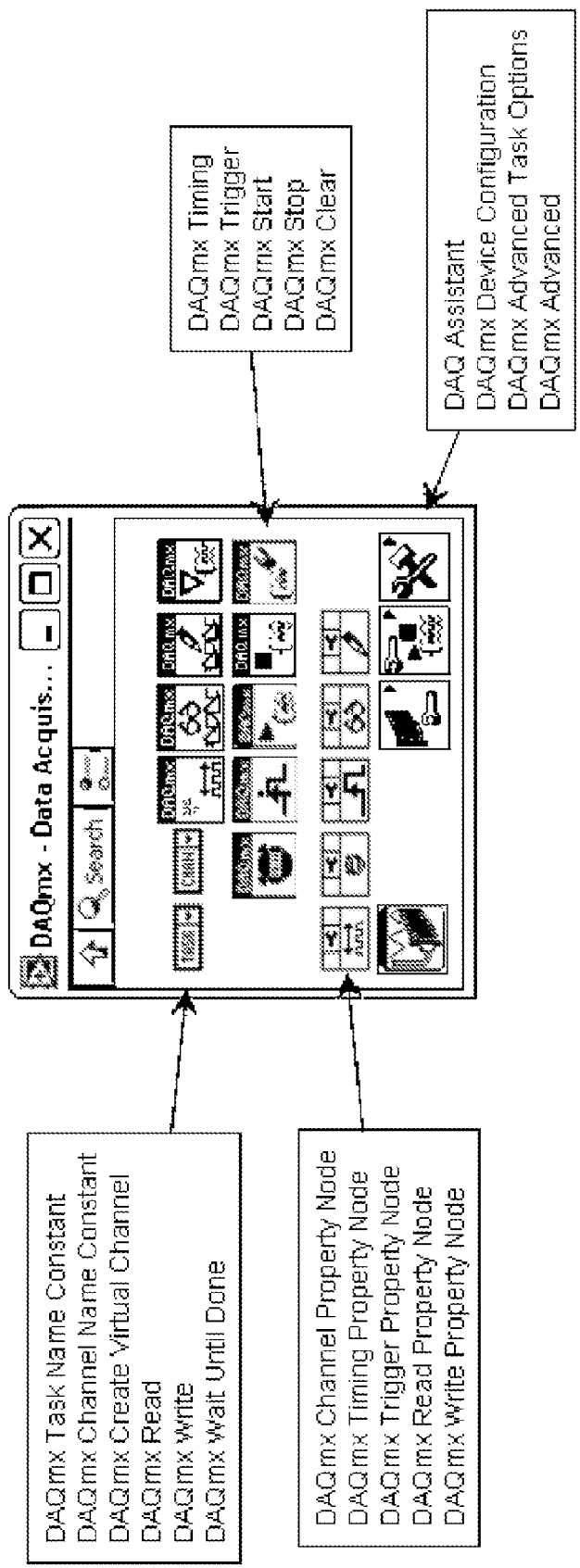
FIG. 5 illustrate one embodiment of a palette for displaying graphical program nodes for use in a graphical program.

FIG. 5—Graphical Program Node Palette

FIG. 5 illustrates one embodiment of a palette for displaying or presenting a plurality of graphical program nodes for use in a graphical program. The palette of FIG. 5 is shown in the context of a data acquisition (DAQ) system, although it should be noted that this is only an exemplary use of the palette, and that any other application domain or field is also contemplated as suitable for the techniques described herein.

As FIG. 5 shows, in this embodiment, a plurality of graphical program nodes is displayed or presented in a display window, where each graphical program node corresponds to a respective functionality available for use in a graphical program. In other words, each graphical program node may be selected by a user (or by programmatic means) for inclusion in the graphical program, where, upon execution of the graphical program, the selected graphical program node executes to perform the functionality. As described above in detail, the inclusion of the graphical program node in the graphical program may be performed in any of a variety of ways, including, for example, the user "dragging and dropping" the node onto a block diagram of the graphical program, and "wiring" the node to one or more other nodes in the program.

In a preferred embodiment, the plurality of graphical program nodes (or node icons) are organized in the display window in a hierarchy of graphical program nodes, where the hierarchy includes a first plurality of function nodes displayed in the display window, each corresponding to a respective functionality, and a second plurality of property nodes displayed in the display window, each corresponding to a respective one of at least a subset of the plurality of function nodes. A property node typically operates to provide access to properties or attributes (i.e., parameters) corresponding to an object or functionality of the graphical program. A property node may be used to set and/or get parameters related to a specific functionality of the graphical program, either manually, i.e., by a user, or programmatically. For example, a user can programmatically (or manually) make changes that affect the output or appearance of controls and indicators, as well as programmatically configure other objects or devices referenced by the graphical program. In one embodiment, the property nodes included in the palette may comprise function specific property nodes, as described in detail below.

In the example palette shown, the function nodes represent respective functionalities for DAQ related graphical programs, including, for example, respective nodes for task and channel creation and/or configuration, virtual channel creation, reading (acquiring data), writing (generating signals or data), and "wait until done" (related to task/device status in a signal generation operation), as may be seen in the top row of the node icons in the palette, as well as respective function nodes for timing, triggering, starting, stopping, and clearing operations for a task implemented by the graphical program, as shown in the second row of node icons in the palette. Again, it should be noted that the particular set of function nodes shown in the palette of FIG. 5 are exemplary only, and are not intended to limit the function nodes to any particular number, function, form or appearance.

In one embodiment, the first plurality of function nodes are organized to correspond to a typical frequency and/or order of use of the function nodes in a typical graphical program development session. For example, in a typical graphical program development session a task or channel (or virtual channel) may first be created, generated, and/or specified, and so the function nodes for these functionalities are presented accordingly, e.g., in the first three positions, viewed left to right, and top to bottom. Once a node for the task or channel creation or configuration has been selected (and/or configured) and included in the graphical program, a read or write node is typically selected, and thus, the next function nodes presented (again, viewing the nodes in the palette in a left to right, and top to bottom manner) are the read and write graphical program nodes, as shown, indicated respectively by "glasses" and "pencil" images on the respective node icons. Adjacent to the write node is the "wait until done" node, indicated by a downward pointing triangle or "yield" symbol on the node icon, which is typically used in conjunction with the write node, and so is presented proximate to the write node. Thus, the function nodes in the top row may be considered to represent "primary" functionalities for possible use in the graphical program.

In the embodiment of FIG. 5, the second row of function nodes may represent possible functionalities that are typically included or specified after the "primary" functions have been selected and included in the graphical program, and thus may be considered to be "secondary" functions. For example, the function nodes included in the second row include (again, viewing left to right, top to bottom) the timing node, triggering node, start node, stop node, and clear node, as mentioned above.

As mentioned above, in one embodiment, each of the second plurality of property nodes displayed in the display window corresponds to a respective one of at least a subset of the plurality of function nodes. For example, in the embodiment shown in FIG. 5, the property nodes include a channel property node, a timing property node, a trigger property node, a read property node, and a write property node, where the channel property node corresponds to the task or channel creation (including virtual channel creation) nodes, e.g., task or channel configuration; the timing property node corresponds to the timing node; the trigger property node corresponds to the trigger node; the read property node corresponds to the read node; and the write property node corresponds to the write node. Thus, each property node is preferably a function specific property node, as described in more detail below.

Note that in other embodiments, other property nodes may also be included in the palette. For example, additional property nodes may include one or more of: a task property node that provides access to one or more general task related parameters, such as for example, a task name, one or more channel names, a number of channels, and/or a task status indicator (e.g., indicating whether a task is done); a calibration information property node that provides access to calibration information for a device used by the graphical program; an export signal property node that provides access to export signal data for the graphical program; a switch channel property node that provides access to a switch channel specification for the graphical program; a switch scan property node that provides access to a switch scanning task specification for the graphical program; a scale property node that provides access to a scale specification for the graphical program; and a system property node that provides access to software configuration information for a host computer system, among others.

Each property node is preferably displayed proximate to the respective one of the at least a subset of the plurality of function nodes. In other words, each property node may be displayed in a manner that indicates its respective association or correspondence with a function node. For example, as shown in the example embodiment of FIG. 5, each property node is presented in a column common with the corresponding function node, e.g., the timing property node is presented in the same column as the timing node, the read property node is presented in the same column as the read node, and so forth. Note that in some embodiments, property nodes that do not specifically correspond to particular function nodes may be displayed separately from those that do, e.g., not proximate to the function nodes.

Although in the example palette of FIG. 5, the property nodes are arranged with respect to corresponding function nodes by column, it should be noted that this particular organization scheme is but one example of node arrangement, and that other schemes are also contemplated. For example, in one embodiment, rather than columns, common rows may indicate relationships between the property nodes and the corresponding function nodes. Thus, any type of spatial organization may be used to indicate the relationships.

In one embodiment, instead of, or in addition to, spatial organization, iconic symbols, shapes, colors, and/or additional graphics, such as lines or boxes, may be used to indicate the relationships between the property nodes and the corresponding function nodes. Thus, in various embodiments, any of various schemes may be used to visually indicate relationships between the property nodes and corresponding function nodes.

Of course, although the nodes are generally organized in accordance with typical usage in a graphical program development process, it is noted that the user may select nodes from the palette in any order desired. The presented node organization is intended to aid the user in the development process in a mnemonic and/or semantic manner. In other words, the presentation of the graphical program nodes may help the user locate the desired nodes, and/or may aid the user in remembering the steps to follow in developing the graphical program. Additionally, in one embodiment, the function node icons and the property node icons may include images that indicate respective correspondences between property nodes and their corresponding function nodes. For example, as FIG. 5 shows, both the timing node icon and the timing property node icon include an image of a stop watch, both the trigger node icon and the trigger property node icon include an image of a leading edge of a waveform, both the read node icon and the read property node icon include an image of glasses, and so forth. In one embodiment, the node icons may have a first appearance when displayed in the palette, and may have a second different appearance when displayed in the graphical program or block diagram. For example, a timing node icon may display a stop watch image in the palette, but may display a text label when placed in the graphical program.

In one embodiment, the palette may also display tool or palette icons representing one or more development and/or configuration tools or sub-palettes, where user selection or activation of each icon may invoke a respective tool or sub-palette. In one embodiment, one or more function palette icons may be displayed in the display window, where each function palette icon represents a respective sub-palette of one or more additional function nodes and/or one or more additional function palettes.

For example, in one embodiment, the one or more function palette icons may be user-selectable to invoke display of one or more of: a palette of function nodes related to advanced device configuration; a palette of function nodes related to advanced task configuration; and a palette of one or more additional sub-palettes comprising miscellaneous advanced function nodes.

More specifically, in the example palette of FIG. 5, the tool or palette icons correspond respectively to a task configuration tool, referred to as DAQ Assistant, a device configuration palette, referred to as DAQmx Device Configuration, an advanced task configuration palette, referred to as DAQmx Advanced Task Options, and an advanced development palette, referred to as DAQmx Advanced. Of course, in other embodiments, other tools and/or palettes are contemplated for iconic presentation in the palette.

In one embodiment the function nodes in the palette may be task based polymorphic function nodes, as described below in detail. In a further embodiment, the property nodes in the palette may be function specific property nodes, as also described in detail below.

Figure 6:
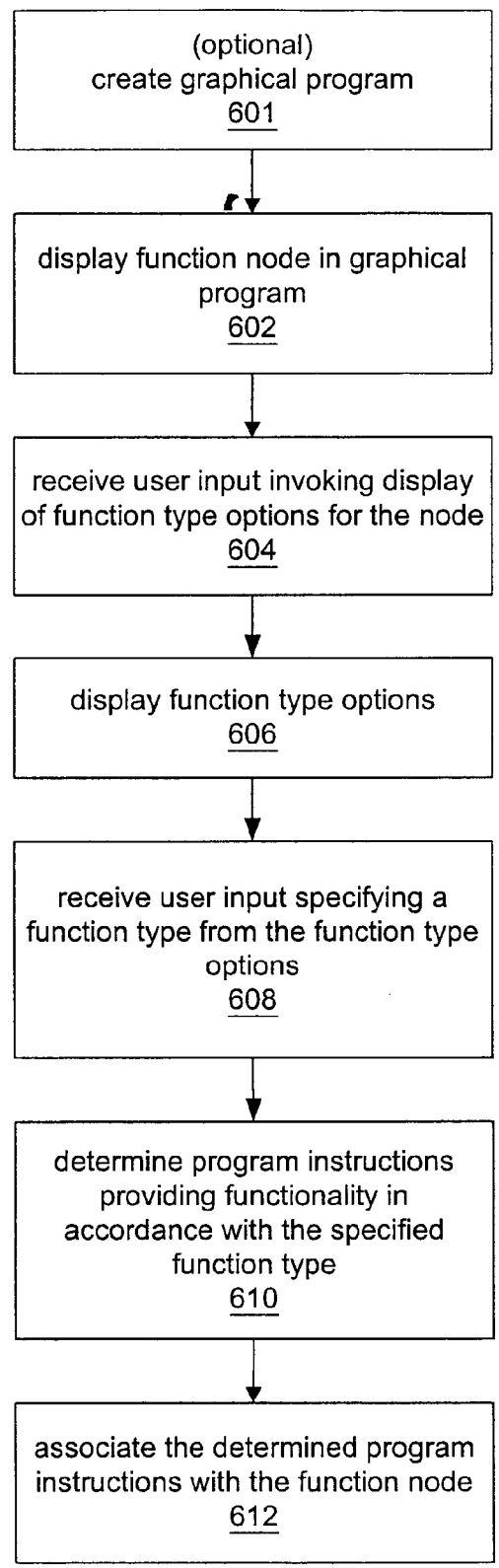
FIG. 6 is a flowchart diagram of a method for using polymorphic function nodes, according to one embodiment.

FIG. 6—Configuration of a Polymorphic Graphical Program Node in a Graphical Program FIG. 6 is a high level flowchart of a method for configuring a polymorphic graphical program node, e.g., during development and/or configuration of a graphical program, where the graphical program implements a task. The polymorphic graphical program function node, referred to herein as the function node, or a "first node", is preferably executable in the graphical program to perform a specified function in accordance with a selectable or switchable function node type, as will be explained in more detail below.

Said another way, FIG. 6 illustrates one embodiment of a method for configuring a computer system, an instrument, or other device to perform a function using one or more polymorphic function nodes, where the method operates in a computer including a memory, a display and a user input device. The method shown in FIG. 6 may be used to configure any of the instruments shown in FIGS. 2A and 2B to perform a specified function, e.g., a measurement function, although various embodiments of the present invention are also applicable to any other type of task, as well. It is noted that in various embodiments, some of the steps may be performed in a different order than shown, or may be omitted. Additional steps may also be performed, as desired. As shown, in one embodiment, this method may operate as follows.

First, in step 601 a graphical program may optionally be created on the computer system 82 (or on a different computer system). The graphical program may be created or assembled by the user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons that visually indicates the functionality of the program. As noted above, the graphical program may comprise a block diagram and may also include a user interface portion or front panel portion. Where the graphical program includes a user interface portion, the user may assemble the user interface on the display. As one example, the user may use the LabVIEW graphical programming development environment to create the graphical program.

In an alternate embodiment, the graphical program may be created in step 601 by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired. The graphical program may implement any of a variety of functions, e.g., a measurement function, which the user desires to be performed by the instrument. For example, in an application where the instrument is an image acquisition device (e.g., smart camera 190), the graphical program may implement an image processing function.

In step 602, a first function node may be displayed in the graphical program, e.g., on a display of the computer 82. In one embodiment, the first function node may be displayed in the graphical program on the display of the computer system in response to user input specifying the first function node. For example, the user input specifying the first function node may include the user dragging and dropping the first function node from a palette to the graphical program, e.g., from the palette of FIG. 5, described above. In a preferred embodiment, the first function node may be polymorphic. Said another say, the first node is preferably function type-switchable. As used herein, the term "polymorphic" refers to nodes which may share a name and/or an icon, but which may have different functionality. Thus, the first polymorphic node may share a name and/or an icon with one or more other nodes, or node functionalities where, depending upon the selected function type, the underlying functionality of the node may be changed or exchanged in accordance with a selected function type, as described below. Stated another way, a polymorphic node may have a single name and/or icon, but may be configured, e.g., by a user, to have different functionality. Thus the polymorphic node may be considered as either a single "node" having a single name and/or an icon, but configurable with different functionality, or may be considered as a plurality of "nodes" which share a single name and/or an icon, with each of these nodes having different functionality.

The polymorphic node may be configured to have different functionality in a particular "function class". Examples of function classes include read, write, timing, and triggering, among others. Thus, a polymorphic read node may be configured to have different read functionality, e.g., the polymorphic read node may be configured for analog or digital reads, single or multi channel, un-scaled data, number of samples, data types (e.g., a 1D waveform array or a 2D array of doubles), etc. In a similar manner, a polymorphic write node may have configurable write parameters for configuring the functionality of the write node, e.g., the polymorphic write node may be configured for analog or digital writes, single or multi channel, un-scaled data, number of samples, data types (e.g., a 1D waveform array or a 2D array of doubles), etc. A polymorphic timing node may be configured to have different timing functionality, e.g., a "Handshaking (Digital)" function type, an "Implicit (Counter)" function type, a "Sample Clock (Analog/Counter)" and a "Use Waveform (Analog Output)" function type, among others. A polymorphic triggering node may be configured to have different triggering functionality, e.g., the polymorphic trigger node may be configured for digital or analog edge for start or reference, analog window for start or reference, etc. A polymorphic channel creation node may be configured to have different channel creation functionality, e.g., the polymorphic channel creation node may be configured for analog or digital input or output, with various phenomena types such as voltage, temperature, current, resistance, strain, frequency, etc., as well as counter input, such as frequency, period, count edges, pulse width, semi period, etc., and output types, such as pulse generation based on frequency, time, or ticks, etc. A more exhaustive list of example function types is presented below.

In an alternate embodiment, a polymorphic node may be configured to have different functionality selected from two or more particular "function classes", e.g., a single "access node" that is polymorphic as to both a read function class and write function class.

In one embodiment, the first node may be displayed in the graphical program in response to user input. In other words, the method may include receiving user input selecting the first node, where displaying the first node in the graphical program is performed in response to receiving the user input selecting the first node. For example, in one embodiment, the first node may be selected from a graphical program palette, such as the palette described above with reference to FIG. 5, where the palette comprises a display window comprising a plurality of graphical program nodes for use in a graphical program, where the plurality of graphical program nodes comprise a hierarchy of graphical program nodes, where the hierarchy includes a first plurality of function nodes, including the first node, displayed in the display window, where each function node corresponds to a respective functionality, and a second plurality of property nodes displayed in the display window, where each property node corresponds to a respective one of at least a subset of the plurality of function nodes, where each property node is displayed proximate to the respective one of the at least a subset of the plurality of function nodes. Please see the description of FIG. 5 above for further details and embodiments of the palette.

In 604, first user input may be received invoking display of a plurality of function type options for the first node. In a preferred embodiment, the first user input may be received by the first node. For example, the user may "left-click" on the node, thereby invoking the display, although any other means of invocation may also be used to invoke the display.

Figure 7A:
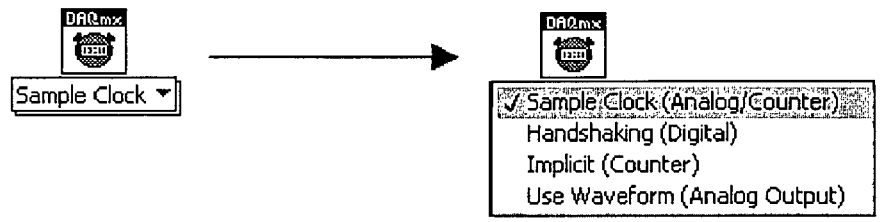
FIGS. 7A-7C illustrate examples of polymorphic function nodes, according to one embodiment.

In 606, the plurality of function type options for the first node may be displayed in response to the first user input. Each function type option displayed may correspond to a respective functionality of the first node. For example, FIG. 7A illustrates a timing function node or VI with polymorphic functionality, a display of function type options (e.g., timing type options) may be displayed. For example, the user may left-click on the function node, and a graphical user interface, e.g., a menu, may be presented showing the available timing function type options. In another embodiment, the timing type options may be presented automatically when the node is deployed to the graphical program, e.g., when the user "drags and drops" the node onto the block diagram of the graphical program. In one embodiment, the function node may be connected (e.g., in response to user input) to one or more other function nodes in the graphical program prior to displaying the plurality of function type options, where, for example, in the timing node example, the timing node is then operable to configure timing functionality for the one or more other function nodes.

As FIG. 7A shows, in this example, the plurality of function type options for the timing node may include a "Handshaking (Digital)" function type, an "Implicit (Counter)" function type, a "Sample Clock (Analog/Counter)" and a "Use Waveform (Analog Output)" function type, where each function type option corresponds to a specific functional version of the timing node functionality.

In one embodiment, the polymorphic node may be originally set with a default function type. For example, as FIG. 7A also shows, the timing polymorphic node may be originally set with the "Sample Clock (Analog/Counter)" function type. Thus, in one embodiment, when the function node is placed on a block diagram, the node may be in a default configured state. In one embodiment, the node or VI may initially appear with a Selector (e.g., labeled "Sample Clock"), referred to as a PolyVI Selector, indicating that it is configured for Sample Clock timing. The user may select (e.g., "click on") this PolyVI Selector to set the node to other functional types of timing. In another embodiment, the polymorphic node may not have a default function type.

In 608, second user input may be received specifying a function type from the plurality of function type options. For example, in the example of FIG. 7A, any of the options shown may be selected by the user, e.g., by clicking on the option, navigating through the options via arrow keys, double-clicking on a menu item, etc. In another embodiment, the function type for a polymorphic function node may be determined programmatically, e.g., based on inputs provided to the node, a current configuration of the system where the node is being used, or other information.

In a preferred embodiment, the second user input may be received by the node. User input received by the node may comprise a user graphically selecting the node, e.g., by clicking on the node. Thus receiving the first user input (in 604) preferably includes receiving the first user input to the first node. Similarly, receiving the second user input (in 608) preferably includes receiving the second user input to the first node, although it should be noted that in other embodiments, the user input may be received by other elements, e.g., by menus or dialogs presented in the development environment, by speech recognition, etc.

Then, in 610, program instructions based on the second user input may be determined, where the determined program instructions are executable to provide functionality in accordance with the specified function type. In other words, once the function type for the node has been selected in 608, the program instructions implementing the selected functionality may be determined. Note that the term "program instructions" may refer to one or more of: machine executable code, text-based program source code, graphical program code, data structures, hardware configuration data, e.g., for a programmable hardware element, and/or any other type of software instructions or data useable in providing functionality for the graphical program.

In one embodiment, each polymorphic function node includes a plurality of different sets of program instructions that correspond to the different function types of the node. When the user selects a particular function type, the sets of program instructions that correspond to that selected function type are associated with the node icon. In another embodiment, the program instructions that correspond to a selected function type are dynamically programmatically created after the user selects the function type. This may allow the programmatically created program instructions to be based on a current configuration of the system or other nodes present in the graphical program.

In 612, the determined program instructions may be associated with the first node. In other words, the node may be configured to include the determined program instructions implementing the desired functionality, where, when the first node executes in the graphical program, the determined program instructions are operable to execute to provide the functionality in accordance with the specified function type.

Although in a preferred embodiment, the first node initially has a default configuration, as noted above, in other embodiments, prior to associating the determined program instructions with the first node, the first node may not have any associated program instructions implementing a specific functionality. In other words, the node may initially be generic, e.g., a substantially "blank slate" which must be configured to perform a desired functionality.

For example, in one embodiment, prior to said associating, the first node may include one of: a generic read node, a generic write node, and a generic channel creation node. After said associating, the first node may include one of: a specific read node in accordance with the specified function type, a specific write node in accordance with the specified function type, and a specific channel creation node in accordance with the specified function type. In other words, where, prior to said associating, the first node includes a generic read node, after said associating, the first node may include a specific read node in accordance with the specified function type. Similarly, where, prior to said associating, the first node includes a generic write node, after said associating the first node may include a specific write node in accordance with the specified function type. Additionally, where, prior to said associating, the first node includes a generic channel creation node, after said associating, the first node may include a specific channel creation node in accordance with the specified function type.

As another example, prior to said associating, the first node may include one of: a generic timing node, and a generic triggering node, and after said associating, the first node may include one of: a specific timing node in accordance with the specified function type, and a specific triggering node in accordance with the specified function type. As noted above, the function classes, e.g., read, write, timing, triggering, channel creation, etc., (and corresponding nodes) presented herein are meant to be exemplary, and are not intended to limit the function classes or polymorphic function nodes to any particular set of classes or nodes.

In one embodiment, where the first node has a first node icon having a first appearance which is displayed in the graphical program, the first node icon may be changed to a second appearance based on the second user input. In other words, the node's visual appearance may be changed to reflect the specified function type of the node. For example, the node icon's color, shape, label, and/or design may be modified to reflect the function type or functionality of the node. In one embodiment, the terminals of the node (icon) may be modified in accordance with the specified function type. In another embodiment, changing the first node icon to a second appearance may include replacing the first node icon with a second node icon.

There are various ways that the node may be configured with the determined program instructions. For example, in an embodiment where, prior to said associating the determined program instructions with the first node, the first node is of a default function type of the plurality of function type options, where the first node has associated default program instructions in accordance with the default function type, and the where the default program instructions implement a first functionality, associating the determined program instructions with the first node may include replacing the default program instructions with the determined program instructions. In other words, the first node's original functionality may be "swapped" with a second functionality (implemented by the determined program instructions).

In another embodiment, the first node may be (programmatically) replaced with a second node, where the second node includes the determined program instructions implementing the desired functionality.

For example, in one embodiment, determining the program instructions based on the second user input may include determining a second node based on the specified function type, where the second node includes the determined program instructions. In this case, associating the determined program instructions with the first node may include replacing the first node in the graphical program with the second node, where the second node is operable to provide functionality for the graphical program in accordance with the specified function type. The first node may include a first node icon, and displaying the first node may include displaying the first node icon. In one embodiment, the second node may include the first node icon, and the determined program instructions. In other words, the first node may be replaced by the second node, but the node icon may not be replaced. In another embodiment, the second node may include a second node icon, and the determined program instructions, i.e., the first node's icon may be replaced by the second node's icon, which is used to display the second node in the graphical program (or in a palette of nodes).

Thus, the second node may include program instructions and/or data structures for implementing timing configuration in accordance with the specified timing type. For example, the second node may include program instructions (and/or data structures) in a text-based programming language such as C or C++ (or any other programming language) which is compilable, interpretable, and/or executable to provide the determined functionality for the graphical program, e.g., upon or during execution of the graphical program.

Thus, similar to the example described above, in one embodiment, the first node may include one of: a generic read node, a generic write node, and a generic channel creation node; and the second node may include one of: a specific read node in accordance with the specified function type, a specific write node in accordance with the specified function type, and a specific channel creation node in accordance with the specified function type. In another embodiment, the first node may include one of: a generic timing node, and a generic triggering node; and the second node may include one of: a specific timing node in accordance with the specified function type, and a specific triggering node in accordance with the specified function type. In other words, where the first node is a generic read node, the second node may be a specific read node in accordance with the specified function type. Similarly, where the first node is a generic write node, the second node may be a specific write node in accordance with the specified function type. Additionally, where the first node is a generic channel creation node, the second node may be a specific channel creation node in accordance with the specified function type.

As further examples, where the first node is a generic timing node, the second node may be a specific timing node in accordance with the specified function type. Furthermore, where the first node is a generic triggering node, the second node may be a specific triggering node in accordance with the specified function type.

Thus, a second node may be determined based on the user input specifying the function type, and the second node may be displayed on the display in the graphical program in place of the first function node, where the second node may be operable to provide functionality for the graphical program in accordance with the selected function type. For example, the second node may be operable to be connected to one or more other nodes in the graphical program to provide functionality in accordance with the specified function type. For example, as described above, user input to the graphical program may be received connecting the second node to one or more other nodes in the graphical program, e.g., by "wiring" the nodes together. During execution of the graphical program, the second node may then operate in conjunction with the one or more nodes.

In one embodiment, the second node may itself be polymorphic, as defined above. In other words, in one embodiment, the second node may be function type-switchable, such that the user may subsequently select a different function type for the second node, thereby invoking replacement of the second node with a third node of the selected function type.

In one embodiment, the second node may also include a block diagram, comprising a graphical representation of the implementation of the node's functionality in accordance with the specified function type. Thus, the block diagram may graphically illustrate the underlying functionality of the second node. In addition to the block diagram, the second node may also include a front panel. The front panel may include one or more controls and/or indicators for interactively setting and displaying one or more parameters during graphical program execution in accordance with the specified function type. Thus, in various embodiments, the second node may include one or more of the second node icon, the front panel, and the block diagram.

Thus, in various embodiments, the implementation of the polymorphic nature of the function node may be considered as a node replacement, where the first node is replaced by the second node comprising appropriate program instructions, and/or as a node configuration, where the first node is configured with a different functionality, i.e., by associating the appropriate program instructions with the first node. Note that in the context of the present invention, these two approaches are considered not so much as distinct and mutually exclusive, but rather as defining a continuum, in that in various embodiments or implementations, various aspects of the node and its functionality may be configured and/or replaced to various degrees as desired, resulting in substantially the same effective conversion of the node functionality.

In one embodiment, the graphical program is executable to perform a measurement task. The second node may then be operable to provide functionality in the graphical program for performance of the measurement task. For example, the measurement task may include one or more of a data acquisition task, and a signal generation task. For example, the computer system 82 may be coupled to one or more data acquisition devices, and execution of the graphical program may invoke a data acquisition process whereby the device(s) acquires data from a data source, e.g., a sensor or other signal source. In an embodiment where the function node (either the configured first node, or the second node) is a read node, the node may then operate to acquire the data from the device and transmit the acquired data to the computer system where the data may be stored or sent to other systems as desired.

Similarly, the computer system 82 may be coupled to one or more signal generation devices, and execution of the graphical program may invoke a signal generation process whereby the device(s) generate one or more signals in accordance with parameters or data supplied by software executing in the computer 82. In other words, in an embodiment where the function node is a write node, the node may operate to send data to the device(s), and the device(s) may then generate signals based on the data, where the generated signals may be used for unit testing, control, alarms, etc. Thus, in one embodiment, the graphical program may be executed to perform a task, e.g., a measurement task, where the function node executes to provide functionality in the graphical program for performance of the task.

In a further embodiment, the second node may include the second node icon and a graphical user interface (GUI), where the GUI includes the one or more controls and/or indicators for enabling a user to set and/or display one or more parameters associated with the node prior to graphical program execution in accordance with the specified function type. In other words, the GUI may provide the user means to configure the parameters before execution of the graphical program.

Figure 7B:
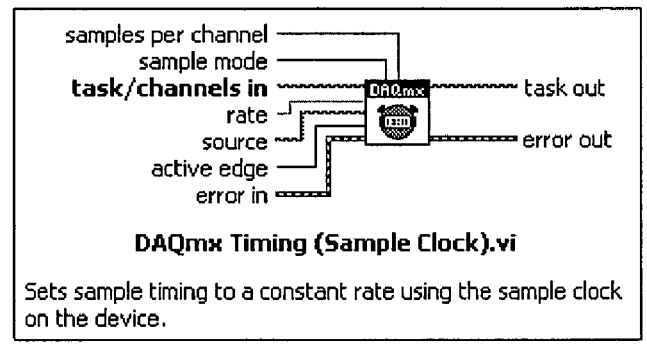
Figure 7C:
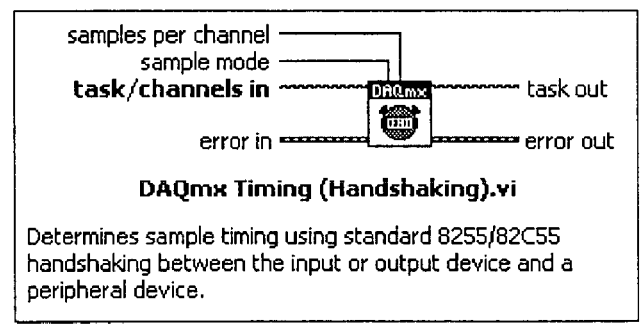

It should be noted that the conversion of the node functionality (e.g., via configuration, replacement, or a combination of both) may change not only the functionality of the node, i.e., the functions used, but may also change its parameters. FIGS. 7B and 7C illustrate example parameter sets for two of the function types shown in FIG. 7A. As FIG. 7B shows, the "Sample Clock" variation shows input parameters that are only relevant for the "Sample Clock" timing functionality. Similarly, as FIG. 7C shows, the "Handshaking" variation includes parameters relevant to that type of timing functionality. Note that "rate", "source", and "active edge" parameters appear in the Sample Clock variation, but not in the Handshaking variation, because these parameters are not appropriate for the Handshaking variation.

Example Function Types for Various Polymorphic Function Nodes

The following are more detailed lists of example function types for some of the polymorphic function nodes mentioned above. The function types are presented in a format that indicates a menu hierarchy, where double arrows indicate sub-menu items, such as in so called "pull-right" menus. It should be noted that the function types and the formats shown are meant to be exemplary only, and are not intended to limit the function types, organization, or presentation format to any particular type, organization, or format.

Figure 8:
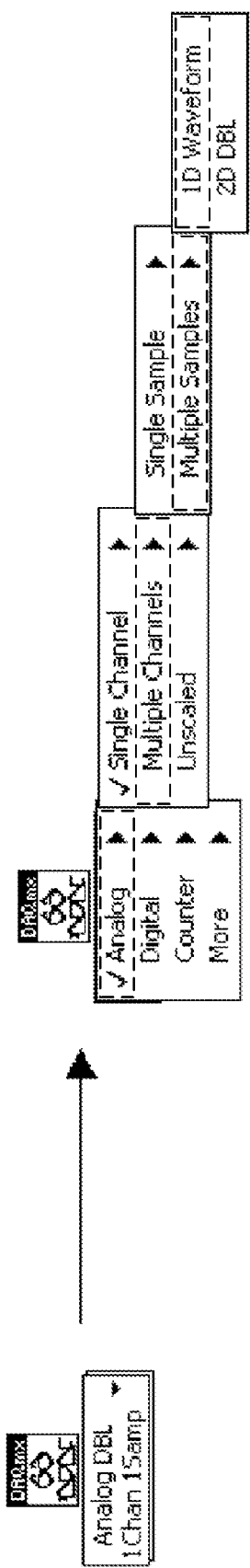
FIG. 8 illustrates another example of a polymorphic function node, according to one embodiment.

Create Channel Function Node
    Analog Input>>Voltage
    Analog Input>>Temperature>>Thermocouple
    Analog Input>>Temperature>>RTD
    Analog Input>>Temperature>>Thermistor>>Current Excitation
    Analog Input>>Temperature>>Thermistor>>Voltage Excitation
    Analog Input>>Current Analog Input>>Resistance
Analog Input>>Strain>>Strain Gage
Analog Input>>Frequency>>Voltage
Analog Input>>More>>Custom Voltage with Excitation
Analog Input>>More>>Temperature Built-In Sensor
Analog Output>>Voltage
Analog Output>>Current
Digital Input
Digital Output
Counter Input>>Frequency
Counter Input>>Period
Counter Input>>Count Edges
Counter Input>>Pulse Width
Counter Input>>Semi Period
Counter Output>>PulseGeneration>>Frequency
Counter Output>>PulseGeneration>>Time
Counter Output>>PulseGeneration>>Ticks
Read or Write Function Nodes
    Analog>>Single Channel>>Single Sample>>DBL
    Analog>>Single Channel>>Single Sample>>Waveform
    Analog>>Single Channel>>Multiple Samples>>1D DBL
    Analog>>Single Channel>>Multiple Samples>>Waveform
    Analog>>Multiple Channels>>Single Sample>>1D DBL
    Analog>>Multiple Channels>>Single Sample>>1D Waveform
    Analog>>Multiple Channels>>Multiple Samples>>2D DBL
    Analog>>Multiple Channels>>Multiple Samples>>1D Waveform
    Analog>>Unscaled>>2D I16
    Analog>>Unscaled>>2D U16
    Digital>>Single Channel>>Single Sample>>Boolean (1 Line)
    Digital>>Single Channel>>Single Sample>>1D Boolean (N Lines)
    Digital>>Single Channel>>Single Sample>>U8 (Port Format)
    Digital>>Single Channel>>Single Sample>>U32 (Port Format)
    Digital>>Single Channel>>Single Sample>>Waveform
    Digital>>Single Channel>>Multiple Samples>>1D U8 (Port Format)
    Digital>>Single Channel>>Multiple Samples>>1D U32 (Port Format)
    Digital>>Single Channel>>Multiple Samples>>Waveform
    Digital>>Multiple Channels>>Single Sample>>1D Boolean (1 Line)
    Digital>>Multiple Channels>>Single Sample>>2D Boolean (N Lines)
    Digital>>Multiple Channels>>Single Sample>>1D U8 (Port Format)
    Digital>>Multiple Channels>>Single Sample>>1D U32 (Port Format)
    Digital>>Multiple Channels>>Single Sample>>1D Waveform
    Digital>>Multiple Channels>>Multiple Samples>>2D U8 (Port Format)
    Digital>>Multiple Channels>>Multiple Samples>>2D U32 (Port Format)
    Digital>>Multiple Channels>>Multiple Samples>>1D Waveform
    Counter>>Single Sample>>DBL
    Counter>>Single Sample>>U32
    Counter>>Multiple Samples>>1D DBL
    Counter>>Multiple Samples>>1D U32
    More>>Raw>>1D U8
    More>>Raw>>1D U16
    More>>Raw>>1D U32
    More>>Raw>>1D I8
    More>>Raw>>1D I16
    More>>Raw>>1D I32
Trigger Node
    Start>>None
    Start>>Digital Edge
    Start>>Analog Edge
    Start>>Analog Window
    Reference>>None
    Reference>>Digital Edge
    Reference>>Analog Edge
    Reference>>Analog Window
    More>>Advance>>None
    More>>Advance>>Digital Edge
Timing Node
    Sample Clock (Analog/Counter)
    Handshaking (Digital)
    Implicit (Counter)
    Use Waveform (Analog Output)
FIG. 8—A Polymorphic Read Function Node FIG. 8 illustrates a more complex example of a polymorphic, i.e., function type-switchable, function node. More specifically, FIG. 8 illustrates a polymorphic DAQ (Data Acquisition) read node. As FIG. 8 shows, in this example, the read node initially has a default function type, e.g., when first placed on a block diagram, specifically, by default, the read node is configured for a single channel, single sample analog acquisition, returning its data in a scalar double-precision number. It should be noted that the polymorphic read node of FIG. 8 is presented as an exemplary function node and is not intended to limit the function node to any particular class, i.e., any particular set of specific functions. As mentioned above, other classes of polymorphic function nodes contemplated include a write node, a timing node, a triggering node, a channel creation node, a task creation node, a virtual channel creation node, a "wait until done" node (related to task/device status in a signal generation operation), a start node, a stop node, and a clear node, among others.

As FIG. 8 also shows, in this example, the invocation of the available function types for the read node results in display of a partial list of function type options, where subsequent function type options are presented in a hierarchy of "pull-right" menus, as shown. In this example, the PolyVI selector indicates that this node or VI may be configured for other types of acquisition (e.g., digital or counter), for one or many channels, for un-scaled data, for one or many samples, and for other data types (e.g., a 1D waveform array or a 2D array of doubles). It should be noted that the selectable function type options shown are exemplary only, and are not intended to limit the function type options to any particular set.

It is noted that in prior art function nodes, only the data type of the nodes were selectable, as represented by the "leaf" level of the menu shown in FIG. 7C. In contrast, according to various embodiments of the present invention, the polymorphism relates to or includes the attributes of the task, e.g., the I/O subsystem (analog vs. digital vs. counter), the number of channels, and the timing (one vs. many samples). Thus, in the prior art approaches, in developing graphical programs, users were required to select from among a collection of many different nodes. In contrast, embodiments of the present invention provide single nodes that may be configured for any of various functionalities, e.g., a single read node and a single write node that can each be configured for many kinds of I/O.

Thus, the function node polymorphism described herein removes the necessity to include many different types of function nodes of the same broad class in a palette, thereby substantially simplifying and easing programming for the user.

FIGS. 9-15—Function Specific Property Nodes

As mentioned above, in one embodiment, function specific property nodes may be provided for use in a graphical program, where the graphical program has a specified functionality, and where each property node may provide access to a plurality of properties or attributes corresponding to a specific function or aspect of the graphical program. In other words, property nodes according to embodiments of the present invention may each correspond to a respective pre-defined object included in or referenced by the graphical program, where the plurality of properties specify a configuration of the object, and where the object is associated with a subset of the functionality of the graphical program.

Note that this is in contrast to prior art property nodes, where a single function node provides access to attributes of the entire graphical program functionality, e.g., possibly via polymorphic means. For example, in one embodiment, the function specific property nodes described herein may be considered to correspond to a function or method hierarchy as opposed to an object hierarchy, in that each function specific property node (e.g., a read property node) includes a collection of properties related to a function or method (a read method), e.g., that operates on a task object. In other words, the function specific property nodes are preferably organized based on methods (e.g., Read, Writer, Trigger, etc.) as opposed to object references (references to VISA sessions, VIs, ActiveX objects, etc.).

Additionally, as will be described in detail below, in some embodiments, the function specific property nodes may be filtered based on hardware.

Figure 9:
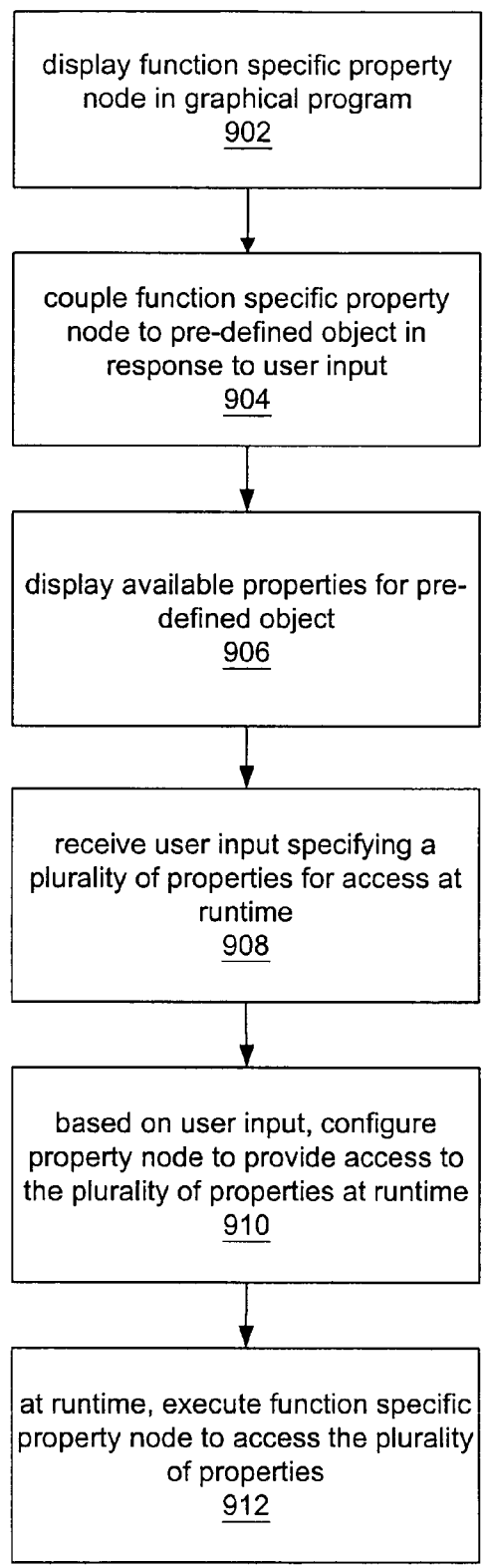
FIG. 9 is a flowchart diagram of a method for using a function specific property node, according to one embodiment.

FIG. 9—Method for Using Function Specific Property Nodes

FIG. 9 is a flowchart diagram of a method for using a function specific property node, according to one embodiment. As noted above, in various embodiments, some of the steps described may be performed concurrently, in a different order, or may be omitted. Additional steps may also be performed as desired.

In 902, a function specific property node may be displayed in a graphical program. For example, in one embodiment, a user may "drag and drop" the property node onto the graphical program, e.g., onto a block diagram of the graphical program, where the graphical program is operable to perform first functionality, such as a specified task. In one embodiment, the user may select the property node from a palette, such as described above with reference to FIG. 5.

In a preferred embodiment, the function specific property node may include a node icon operable to be displayed in the graphical program, and a first set of program instructions executable to provide access to a plurality of properties corresponding to a fixed specific function, where the plurality of properties specify a configuration of the specific function, and where the specific function is a subset of the first functionality of the graphical program. Said another way, the first set of program instructions may be executable to only provide access to a plurality of properties corresponding to a pre-defined object, where the plurality of properties specify a configuration of the object, and where the object is associated with a subset of the first functionality of the graphical program.

The node icon preferably includes an image that indicates the specific function or object associated with the property node, as described above with reference to FIG. 5. For example, a timing property node icon may include an image of a stopwatch or other symbol or label indicating the timing functionality with which the property node is associated.

The pre-defined object may be any type of object used or referenced by the graphical program to perform the first functionality or task. In one embodiment, the object may be a software object, such as a graphical program element included in or used by the graphical program. For example, in one embodiment, the software object may be a function node included in the graphical program. Examples of function nodes that may be included in the graphical program and which may have corresponding property nodes include, but are not limited to, a timing node, operable to provide timing functionality for the graphical program; a triggering node, operable to provide triggering functionality for the graphical program; a read node, operable to provide data acquisition (DAQ) functionality for the graphical program; a write node, operable to provide signal generation functionality for the graphical program; and a channel creation node, operable to generate a channel specification for the graphical program.

In another embodiment, the object may be a data structure used by the graphical program to perform the first functionality. For example, in one embodiment, the object may be a task specification, where the task specification includes general task information, including, for example: a task name, one or more channel names, a number of channels, and/or a task status indicator. In this case, the function specific property node may be a task property node, whereby parameters of the task specification may be accessed. In another embodiment, the object may be a channel specification, where the channel specification includes specification information for one or more channels for performing the first functionality. In this case, the function specific property node may be a channel property node, whereby parameters of the channel specification may be accessed.

Other examples of function specific property nodes corresponding to data structures and/or information include, but are not limited to: a calibration information property node, operable to access calibration information for a device used by the graphical program; an export signal property node, operable to access an export signal data structure storing export signal data for the graphical program; a switch channel property node, operable to access a switch channel specification for the graphical program; a switch scan property node, operable to access a switch scanning task specification for the graphical program; a scale property node, operable to access a scale specification for the graphical program; and a system property node, operable to access a data structure storing software configuration information for the host computer system, among others.

In yet another embodiment, the object may be a hardware device. In one embodiment, the property node may be coupled to or associated with the hardware device through an intermediate software object. For example, the graphical program may include a graphical program element associated with or representing the hardware device, where the property node may be coupled to the device via the graphical program element. The property node may operate to provide access to properties or attributes of the hardware device as described above.

In one embodiment, the hardware device may be a DAQ device, where the properties or attributes specify the configuration of the device. For example, the device may be a DAQ board comprised in a slot of the computer system, or in a chassis, or may be a device or instrument coupled to the computer system via a cable or other transmission medium. In one embodiment, the hardware device may be a signal generation device, operable to receive a waveform and generate a signal, e.g., for use in industrial testing. In another embodiment, the device may be a switch device, where the function specific property node is a switch device property node.

Thus, in various embodiments, the object may be a property node, a data structure, such as a task or channel specification, for example, represented by a graphical program element, or a hardware device, also represented by a graphical program element, among others.

As noted above, the object is preferably operable to perform a specific function in accordance with the plurality of properties, where the specific function is a subset of the first functionality of the graphical program. Note that the function performed by the object may be active, such as performing a read or write function, or may be passive, such as providing a task specification or other data structure for use by another aspect of the graphical program. In a preferred embodiment, the property node is statically typed to correspond to the pre-defined object. This is in contrast to the prior art approaches mentioned above, where for example, polymorphic property nodes are dynamically typed depending upon the graphical program elements, e.g., function nodes, with which they are associated.

Thus, the property node may be operable to be included in the graphical program, where the graphical program has a first functionality, and where the property node corresponds to a respective subset of the first functionality, and thus comprises a function specific property node. Note that since a given property node corresponds to specific subsets of graphical program functionality, in one embodiment, the graphical program may include one or more property nodes, each corresponding to a respective subset of the first functionality, and each thus comprising a function specific property node.

In 904, the function specific property node may be coupled to the pre-defined object in response to user input. For example, in one embodiment, the user may draw a "wire" or otherwise specify an explicit link between the property node and the object, or between the property node and a graphical program element representing the object. Other means of coupling the property node to the object are also contemplated, including, for example, specifying the coupling via text entry, dragging and dropping node icons, and so forth. In another embodiment, the property node may be coupled to the object through an implicit link. In other words, the coupling between the property node and the object may be invisible to the user.

As noted above, in one embodiment, the node icon may visually indicate the specific function or object to which it corresponds. For example, as described above with reference to FIG. 5, in one embodiment, the property node icons may include images that indicate respective correspondences between property nodes and corresponding function nodes. For example, as FIG. 5 shows, both the timing node icon and the timing property node icon may include an image of a stop watch, both the trigger node icon and the trigger property node icon may include an image of a leading edge of a waveform, both the read node icon and the read property node icon may include an image of glasses, and so forth. In one embodiment, the node icon may visually indicate the specific function or object with an alphanumeric label, such as shown in the property node of FIG. 10, described below.

In embodiments where the property node may not correspond specifically to a function node, the property node icon may similarly include an image or label that reflects or indicates the function or object associated with the property node, such as a task or channel specification, hardware device, computer system, etc.

Figure 10:
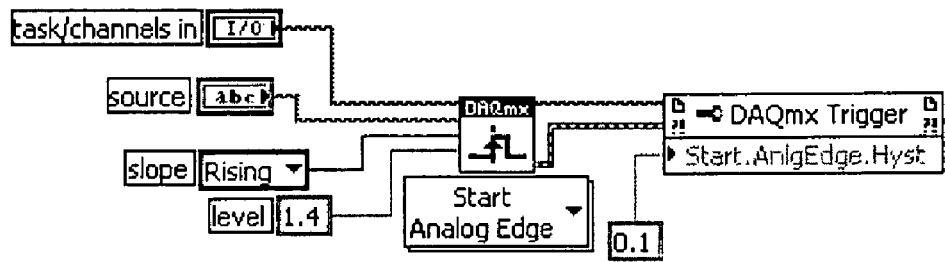
FIG. 10 illustrates one embodiment of a function specific property node.

In one embodiment, the node icon may change when the property node is placed in or deployed to the graphical program. For example, the node icon may include a descriptive image when displayed in a palette, such as a clock image (for a timing property node) or a trigger image (for a triggering property node), but may change to a text label describing the function or object when placed in the graphical program, as shown in FIG. 10, and described below.

In 906, available properties for the pre-defined object may be displayed. In one embodiment, the available properties may be displayed in response to user input. For example, in one embodiment, the user may click on the node icon with a mouse or other pointing device, thereby invoking the display, or, alternatively, invoking a menu from which the display may be invoked. Other methods of invoking the display of the available properties are also contemplated. For example, the user may "drag and drop" the property node from a palette, such as the palette described above with reference to FIG. 5, thereby invoking the display of the available properties.

In 908, user input specifying a plurality of properties from the available properties may be received. The specified plurality of properties may comprise those properties which may be accessed via the property node at runtime, as described below in detail. For example, in one embodiment, the user may use a mouse or other pointing device to select the plurality of properties from the available properties, e.g., by clicking on the desired properties, by dragging a selection box around the desired properties, etc., as is well known in the art, although other means of selecting the plurality of properties are also contemplated.

In response to the user input of 908, the property node may be configured to provide access to the plurality of properties at runtime of the graphical program, as indicated in 910. Various types of access provided by the property node are described below.

Thus, in one embodiment, at edit time, the first set of program instructions may be executable to display available properties of the object, including the plurality of properties, and to receive user input indicating or selecting the plurality of properties, where the access to the plurality of properties is provided in response to the received first user input. Note that as used herein, the term "edit time" refers to any time prior to runtime of the graphical program. For example, during development of the graphical program, the user may select the plurality of properties from the displayed available properties using a pointing device such as a mouse, in response to which the property node may be configured to provide access to the selected properties during execution of the graphical program.

In one embodiment, prior to, or as part of, receiving user input selecting the plurality of properties from the available properties, user input invoking a filtering process on the available properties may be received, resulting in display of a subset of the available properties. The plurality of properties specified for access at runtime may then be selected from this subset. Further details of this property or attribute filtering are provided below with reference to FIGS. 11-15.

In some embodiments, many of the commonly accessed properties of a function node (or other object) may be accessed through the function node (or object) itself. In cases where some of the attributes or properties of the function node are not accessible through the function node, e.g., properties that are not commonly accessed by a user, a function specific property node may be provided that provides access to these lesser-used properties. In other words, in one embodiment, access to the properties of the function node may be extended through the function specific property node.

An example of a graphical program (or portion of a graphical program) that includes such a function node and a corresponding function specific property node is illustrated in FIG. 10. In the example program of FIG. 10, a triggering function node, shown with an icon representing a rising edge trigger on a square waveform, is coupled to a corresponding triggering property node, labeled "DAQmx Trigger". As FIG. 10 shows, the DAQmx Trigger node is configured to set an Analog Edge Start Trigger, and has input parameters for task, source, slope and level. However, the function node does not have a hysteresis parameter, where, as is well known in the art, hysteresis is used by some hardware to affect how the analog edge trigger is detected. While the function node itself does not provide access to this parameter, the triggering property node does. Thus, if the user wishes to affect or view the hysteresis parameter, it may be accessed via the triggering property node. Thus, the functionality of the trigger node (VI) may be extended by using a function specific property node, where the function node is used to configure the most common trigger settings, and the property node is used to affect a specific (less used) property related to the trigger.

Once the property node has been configured to provide access to the plurality of properties as described above, the graphical program may be executed to perform the first functionality, where during execution of the graphical program, the first set of program instructions may execute to provide access to the properties, as indicated in 912 of FIG. 9. In other words, at runtime, the function specific property node may be executed to access the plurality of properties.

For example, in one embodiment, the first set of program instructions may execute to read at least one of the plurality of properties from the object, and to provide the at least one property to a graphical program element included in the graphical program. In one embodiment, the graphical program element may be a GUI, such as a meter, graph, or other display element, where the GUI operates to display the at least one property during execution of the graphical program. For example, referring to the example of FIG. 10, where the object is a trigger function node, the graphical program may include a front panel with an alphanumeric display, where the property node operates to read the hysteresis parameter and provide it to the alphanumeric display where it may be viewed by the user.

In another embodiment, the graphical program element may be executable to perform a respective function based on the at least one property. For example, in an embodiment where the object is a hardware device with an alarm state property, the property node may operate to read the alarm state and provide the state to another node in the graphical program. The other node may then examine the value of the state property and perform an action based on the value, e.g., emitting an audible signal, flashing an icon, logging an event to file, etc. Note that this alarm example is but one example of performing a respective function based on the property read by the property node, and that in other embodiments, any other type of function or action may be performed based on the read property or attribute.

In a further embodiment, during execution of the graphical program, the first set of program instructions may execute to receive input specifying a modification to at least one of the properties, and modify at least one of the properties to configure the object to perform the specific function in response to the input. For example, the input may be received from another graphical program element in the graphical program. In one embodiment, the other graphical program element may be a control, where the control receives user input specifying the modification. The property node may then receive the input from the control and modify the property of the object accordingly. In another embodiment, the other graphical program element may receive input from another source, such as yet another graphical program element or a hardware device, or alternatively, may generate the input itself, and send the input to the property node, which may then receive the input and modify the object property or attribute accordingly.

FIGS. 11-15—Attribute Filtering for Function Specific Property Nodes

As noted above, in one embodiment, prior to, or as part of, receiving the user input selecting the plurality of properties, the first set of program instructions may be executable to display one or more filtering options for the available properties of the object, including the plurality of properties, and to receive user input indicating a first filtering option of the one or more filtering options. The program instructions may then display a first subset of the available properties in accordance with the first filtering option.

Figure 11:
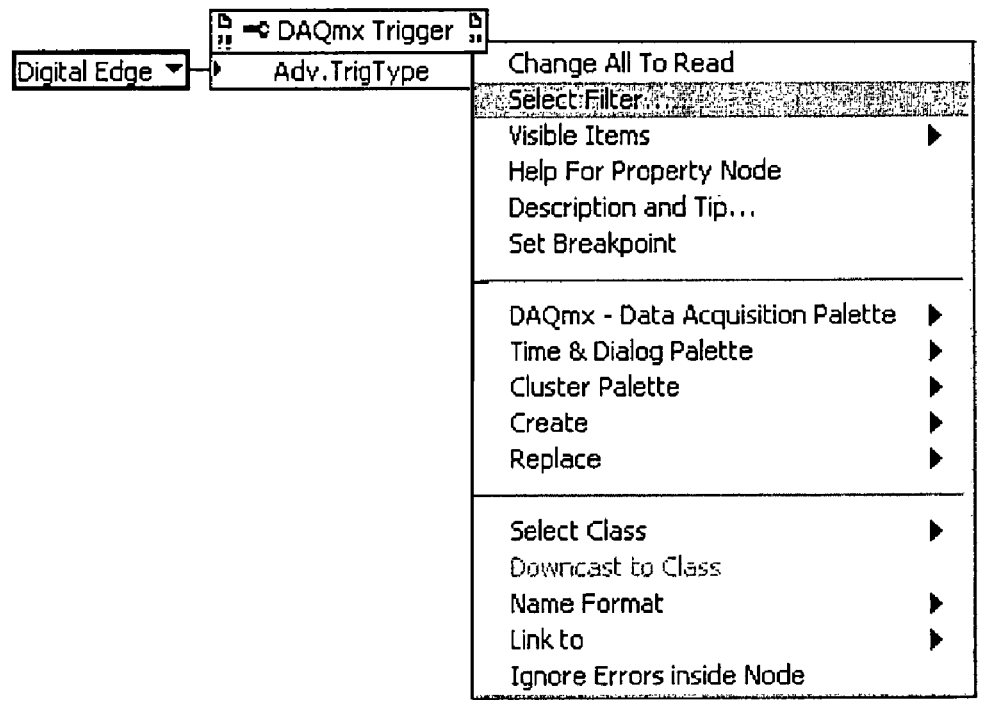
FIG. 11 illustrates invocation of a properties filtering options display from a function specific property node, according to one embodiment.

FIG. 11 illustrates an embodiment of the triggering property node of FIG. 10, where the available properties of the triggering function node may be filtered prior to the selection of the plurality of properties by the user described above. As FIG. 11 shows, in one embodiment, user input to the property node may invoke a menu whereby presentation of the filtering options may be invoked.

Figure 12:
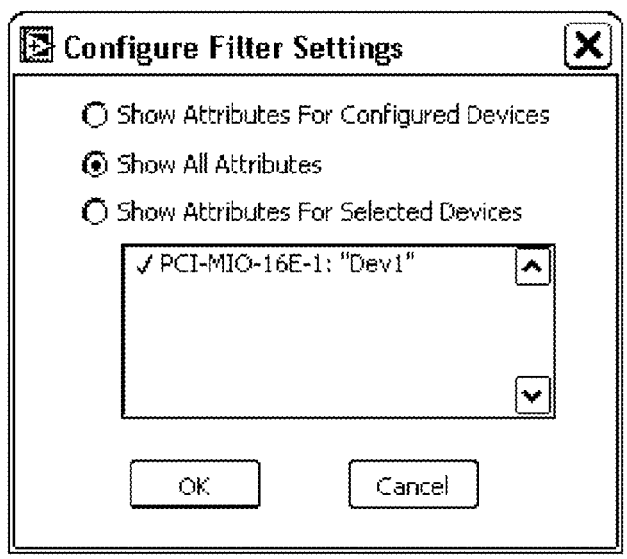
FIGS. 12 and 13 illustrate selection and results of an example properties filtering option for a function specific property node, according to one embodiment.

FIG. 12 illustrates a display of filtering options for the triggering property node, according to one embodiment. As shown, in this example, three basic filtering options are presented: 1) show attributes for configured devices; 2) show all attributes; and 3) show attributes for selected devices. It should be noted that the particular filtering options shown are intended to be exemplary only, and are not intended to limit the filtering options to any particular functionality. In this example, filtering option 1 specifies that all triggering properties or attributes for all devices configured in the system be displayed. Thus, for example, if the host system includes a DAQ board and additional hardware, say, in a chassis coupled to the host system, then all triggering attributes or properties for both the DAQ board and the additional hardware will be presented as available for selection by the user.

Figure 13:
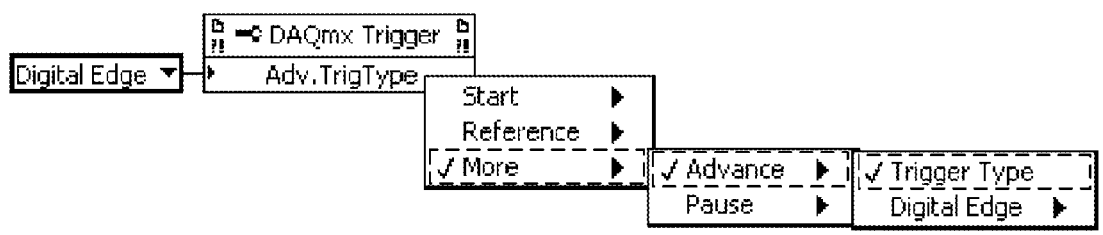

FIG. 13 illustrates an example result from selection of filtering option 1 on the DAQmx triggering property node of FIG. 11. As shown, the property node is configured for an "Advance" trigger type (which can advance a switch from one state to the next). This kind of trigger is not available with the current installed DAQ device, a PCI-MIO-16E-1, labeled "Dev1", but the property is still made available in case this hardware is added later.

Figure 14:
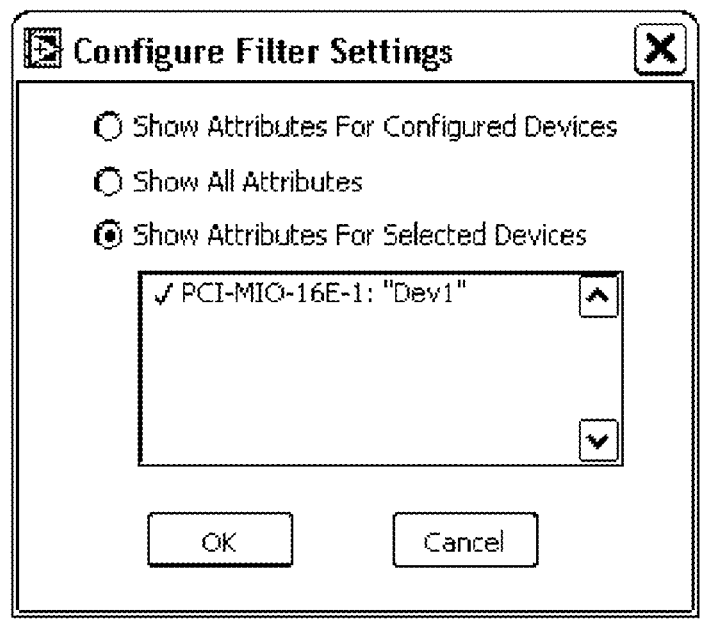
FIGS. 14 and 15 illustrate selection and results of another example properties filtering option for a function specific property node, according to one embodiment.
Figure 15:
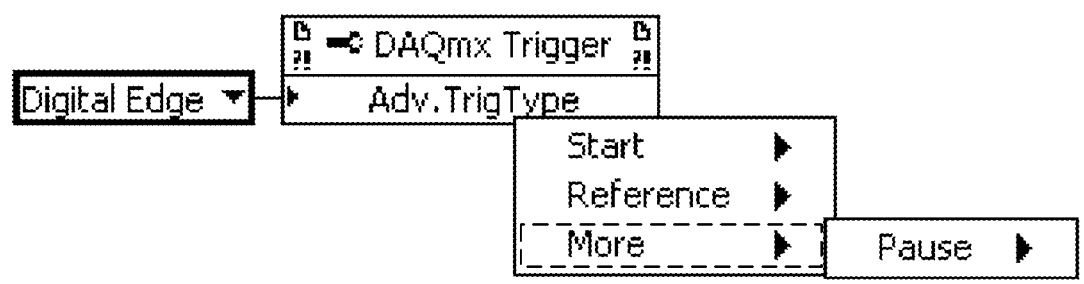

Filtering option 2 specifies that all triggering properties or attributes for all available resources (not just those configured on the system). Finally, filtering option 3 specifies that triggering properties or attributes for selected devices be displayed, where, as shown in FIG. 14, the devices may be selected from the scroll list of devices presented on the dialog. In this particular example, the PCI-MIO-16E-1, labeled "Dev1", has been selected, and thus selection of this option will result in the display of triggering properties or attributes for this device. FIG. 15 illustrates an example result from selection of filtering option 3 shown in FIG. 14. As FIG. 15 shows, selection of filtering option 3 specifies filter settings to only show properties for the selected device, and since this device does not support the "Advanced" trigger type, the displayed property list hides the settings for the "Advance" trigger. In other words, only those triggering properties appropriate for or supported by the selected device(s) are presented.

These filtering options may allow the presentation of DAQmx properties to be simplified when the specific hardware to be used is known, but may also allow the user to view every property when writing an application for hardware not currently owned or installed on the system.

As noted above, once the properties have been filtered, the resulting list of properties may be displayed to the user as available properties (a subset of the original available properties), and the user may then select one or more properties for access by the function specific property node during execution of the graphical program.

Thus, the plurality of properties may be determined in response to the received user input selecting the filtering option and the user input selecting the plurality of properties. In one embodiment, the one or more filtering options for the available properties of the object may be displayed in response to user input invoking the display.

Said another way, in one embodiment, the first set of program instructions may be further executable to display the one or more filtering options for the available properties of the object. The user input indicating the plurality of properties may include user input indicating a first filtering option of the one or more filtering options, where the first set of program instructions are further executable to display a first subset of the available properties in accordance with the first filtering option, including the plurality of properties, and where the input indicating the plurality of properties further comprises user input indicating the plurality of properties from, the first subset of the available properties.

In one embodiment, the function specific property nodes described herein may be considered to present a hierarchy that is not so much an object hierarchy as it is a method hierarchy, in that each property node includes a collection of properties related to a respective method that operates on a task object, e.g., a task specification.

Although the embodiments described herein are presented in the context of a DAQ application, it should be noted that the methods and techniques described herein are broadly applicable across a wide variety of domains and fields, including, for example, test and measurement, process or system control and automation, simulation, machine vision, and data or image processing, among others.

Similarly, it should be noted that the task to be performed by the graphical program may include any type of functionality desired, including, for example, an industrial automation function, a process control function, a test and measurement function, and/or a simulation function, among others. As noted above, the graphical program may operate to perform the task in conjunction with one or more devices, e.g., DAQ devices, motion controllers, cameras, sensors, etc.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A computer-accessible memory medium that stores program instructions executable by a processor to perform:
    displaying a node in a graphical program;
    receiving first user input invoking display of a plurality of functions for the node;
    displaying the plurality of functions for the node in response to the first user input;
    receiving second user input selecting a function from the plurality of functions;
    determining graphical program code based on the second user input, wherein the determined graphical program code comprises a graphical representation of an implementation of the selected function, and wherein the determined graphical program code is executable to provide functionality in accordance with the selected function;
    associating the determined graphical program code with the node, wherein, when the node in the graphical program executes, the determined graphical program code executes to provide the functionality in accordance with the selected function.

2. The memory medium of claim 1, wherein the node has a first node icon which is displayed in the graphical program, and wherein the first node icon has a first appearance, wherein the program instructions are further executable to perform:
    changing the first node icon to a second appearance based on the second user input, wherein said changing the first node icon to a second appearance includes displaying an image corresponding to the selected function.

3. The memory medium of claim 2,
    wherein said changing the first node icon to a second appearance comprises replacing the first node icon with a second node icon.

4. The memory medium of claim 1, wherein, prior to said associating the determined graphical program code with the node, the node does not have any associated graphical program code.

5. The memory medium of claim 1,
    wherein, prior to said associating the determined graphical program code with the node, the node has associated default graphical program code in accordance with a default function for the node, and wherein the default graphical program code implements a first functionality; and
    wherein said associating the determined graphical program code with the node comprises replacing the default graphical program code with the determined graphical program code.

6. The memory medium of claim 1,
    wherein said receiving first user input comprises receiving the first user input to the node; and
    wherein said receiving second user input comprises receiving the second user input to the node.

7. The memory medium of claim 1,
    wherein said displaying the plurality of functions for the node in response to the first user input comprises:
        displaying a plurality of function classes for the node; and
        in response to user input selecting a function class, displaying the plurality of functions, wherein the plurality of functions are in the selected function class.

8. The memory medium of claim 1,
    wherein the node is a data acquisition (DAQ) node;
    wherein the plurality of functions for the node comprise a plurality of DAQ functions;
    wherein, prior to said associating, the DAQ node comprises one of:
        a generic read node;
        a generic write node;
        a generic channel creation node;
        a generic timing node; or
        a generic triggering node; and
    wherein, after said associating, the DAQ node comprises one of:
        a specific read node in accordance with the selected function;

a specific write node in accordance with the selected function;
a specific channel creation node in accordance with the selected function;
a specific timing node in accordance with the selected function; or
a specific triggering node in accordance with the selected function.

9. A computer-implemented method for configuring a graphical program node, comprising:
displaying a node in a graphical program;
receiving first user input invoking display of a plurality of functions for the node;
displaying the plurality of functions for the node in response to the first user input;
receiving second user input selecting a function from the plurality of functions;
determining graphical program code based on the second user input, wherein the determined graphical program code comprises a graphical representation of an implementation of the selected function, and wherein the determined graphical program code is executable to provide functionality in accordance with the selected function;
associating the determined graphical program code with the node, wherein, when the node in the graphical program executes, the determined graphical program code executes to provide the functionality in accordance with the selected function.

10. The method of claim 9, wherein the node has a first node icon which is displayed in the graphical program, the method further comprising:
changing the first node icon to a second appearance based on the second user input, wherein said changing the first node icon to a second appearance includes displaying an image corresponding to the selected function.

11. The method of claim 10,
wherein said changing the first node icon to a second appearance comprises replacing the first node icon with a second node icon.

12. The method of claim 9, wherein, prior to said associating the determined graphical program code with the node, the node does not have any associated graphical program code.

13. The method of claim 9,
wherein, prior to said associating the determined graphical program code with the node, the node has associated default graphical program code in accordance with a default function for the node, and wherein the default graphical program code implements a first functionality; and
wherein said associating the determined graphical program code with the node comprises replacing the default graphical program code with the determined graphical program code.

14. The method of claim 9,
wherein said receiving first user input comprises receiving the first user input to the node; and
wherein said receiving second user input comprises receiving the second user input to the node.

15. The method of claim 9,
wherein said displaying the plurality of functions for the node in response to the first user input comprises:
displaying a plurality of function classes for the node; and
in response to user input selecting a function class, displaying the plurality of functions, wherein the plurality of functions are in the selected function class.

16. The method of claim 9,
wherein the node is a data acquisition (DAQ) node;
wherein the plurality of functions for the node comprise a plurality of DAQ functions;
wherein, prior to said associating, the DAQ node comprises one of:
a generic read node;
a generic write node;
a generic channel creation node;
a generic timing node; or
a generic triggering node; and
wherein, after said associating, the DAQ node comprises one of:
a specific read node in accordance with the selected function;
a specific write node in accordance with the selected function;
a specific channel creation node in accordance with the selected function;
a specific timing node in accordance with the selected function; or
a specific triggering node in accordance with the selected function.

17. A computer-accessible memory medium that stores program instructions executable by a processor to perform:
displaying a node in a graphical program;
receiving first user input invoking display of a plurality of functions for the node;
displaying the plurality of functions for the node in response to the first user input;
receiving second user input selecting a function from the plurality of functions;
determining a second node based on the selected function, wherein the second node comprises a graphical representation of an implementation of the selected function, and wherein the second node comprises graphical program code executable to provide functionality in accordance with the selected function;
replacing the node in the graphical program with the second node, wherein, when the second node in the graphical program executes, the graphical program code of the second node executes to provide the functionality in accordance with the selected function.

18. The memory medium of claim 17, wherein the node comprises a first node icon, and wherein said displaying the node comprises displaying the first node icon, and wherein the second node comprises:
the first node icon and the graphical program code; or
a second node icon and the graphical program code.

19. The memory medium of claim 17, wherein the node and/or the second node is one or more of:
polymorphic;
function switchable; or
function class switchable.

20. The memory medium of claim 17,
wherein the node is a data acquisition (DAQ) node;
wherein the DAQ node comprises one of:
a generic read node;
a generic write node;
a generic channel creation node;
a generic timing node; or
a generic triggering node; and
wherein the second node comprises a corresponding one of:

a specific read node in accordance with the selected function;

a specific write node in accordance with the selected function;

a specific channel creation node in accordance with the selected function;

a specific timing node in accordance with the selected function; or a specific triggering node in accordance with the selected function.

21. A computer-implemented method for configuring a graphical program node, comprising:

displaying a node in a graphical program;

receiving first user input invoking display of a plurality of functions for the node;

displaying the plurality of functions for the node in response to the first user input;

receiving second user input selecting a function from the plurality of functions;

determining a second node based on the selected function, wherein the second node comprises a graphical representation of an implementation of the selected function, and wherein the second node comprises graphical program code executable to provide functionality in accordance with the selected function;

replacing the node in the graphical program with the second node, wherein, when the second node in the graphical program executes, the determined graphical program code executes to provide the functionality in accordance with the selected function.

22. The method of claim 21, wherein the node comprises a first node icon, and wherein said displaying the node comprises displaying the first node icon, and wherein the second node comprises:

the first node icon and the graphical program code; or a second node icon and the graphical program code.

23. The memory medium of claim 21, wherein the node and/or the second node is one or more of:

polymorphic;

function switchable; or function class switchable.

24. The memory medium of claim 21, wherein the node is a data acquisition (DAQ) node;

wherein the DAQ node comprises one of:
   a generic read node;
   a generic write node;
   a generic channel creation node;
   a generic timing node; or
   a generic triggering node; and wherein the second node comprises a corresponding one of:
   a specific read node in accordance with the selected function;
   a specific write node in accordance with the selected function;
   a specific channel creation node in accordance with the selected function;
   a specific timing node in accordance with the selected function; or
   a specific triggering node in accordance with the selected function.

* * * * *